US011862467B2

(12) United States Patent
Chen et al.

(10) Patent No.: US 11,862,467 B2
(45) Date of Patent: Jan. 2, 2024

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chia-Chung Chen, Keelung (TW); Chung-Hao Chu, Hsinchu (TW); Chi-Feng Huang, Hsinchu County (TW); Victor Chiang Liang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/839,682

(22) Filed: Jun. 14, 2022

(65) Prior Publication Data

US 2022/0310395 A1  Sep. 29, 2022

Related U.S. Application Data

(62) Division of application No. 16/883,955, filed on May 26, 2020, now Pat. No. 11,380,548.

(60) Provisional application No. 62/955,077, filed on Dec. 30, 2019.

(51) Int. Cl.
| | | |
|---|---|---|
| H01L 21/26 | (2006.01) | |
| H01L 21/265 | (2006.01) | |
| H01L 21/8234 | (2006.01) | |
| H01L 29/78 | (2006.01) | |
| H01L 29/66 | (2006.01) | |

(52) U.S. Cl.
CPC .... *H01L 21/265* (2013.01); *H01L 21/823431* (2013.01); *H01L 29/66795* (2013.01); *H01L 29/785* (2013.01)

(58) Field of Classification Search
CPC .......... H01L 21/265; H01L 21/823431; H01L 29/66795; H01L 29/785; H01L 29/66803; H01L 21/2652; H01L 21/26586; H01L 29/7853; H01L 21/26513
USPC ...................................................... 257/365
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |

(Continued)

FOREIGN PATENT DOCUMENTS

| | | | |
|---|---|---|---|
| CN | 105097495 A | * | 11/2015 |
| CN | 106847683 A | * | 6/2017 |

*Primary Examiner* — Mohammad M Hoque
(74) *Attorney, Agent, or Firm* — WPAT LAW; Anthony King

(57) ABSTRACT

A method of manufacturing a semiconductor structure, comprising providing a substrate; forming a fin structure over the substrate; depositing an insulation material over the fin structure; performing a plurality of ion implantation cycles in-situ with implantation energy increased or decreased stepwise; and removing at least a portion of the insulation material to expose a portion of the fin structure.

20 Claims, 21 Drawing Sheets

(56) References Cited

U.S. PATENT DOCUMENTS

| | | |
|---|---|---|
| 9,520,482 B1 | 12/2016 | Chang et al. |
| 9,548,303 B2 | 1/2017 | Lee et al. |
| 9,576,814 B2 | 2/2017 | Wu et al. |
| 2014/0097487 A1* | 4/2014 | Yen .................. H01L 29/66803 257/E29.267 |
| 2018/0233502 A1* | 8/2018 | Balakrishnan .... H01L 21/76224 |
| 2019/0006361 A1* | 1/2019 | Zhou ................ H01L 29/66795 |

* cited by examiner

US 11,862,467 B2

SEMICONDUCTOR STRUCTURE AND METHOD OF MANUFACTURING THE SAME

PRIORITY CLAIM AND CROSS-REFERENCE

This application a divisional application of U.S. patent application Ser. No. 16/883,955 filed on May 26, 2020, entitled of "METHOD OF MANUFACTURING SEMICONDUCTOR STRUCTURE THROUGH MULTI-IMPLANTATION TO FIN STRUCTURES", claims priority to U.S. Provisional Application No. 62/955,077 filed on 30 Dec. 2019, entitled "Semiconductor Structure and Method for Forming the Same"; each of these applications are incorporated herein by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls. Although existing FinFET devices and methods of fabricating FinFET devices have been generally adequate for their intended purposes, they have not been entirely satisfactory in all respects. For example, a variation of fin width and profile, especially at an end of the fin, raises challenges in a FinFET process development. It is desired to have improvements in this area.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
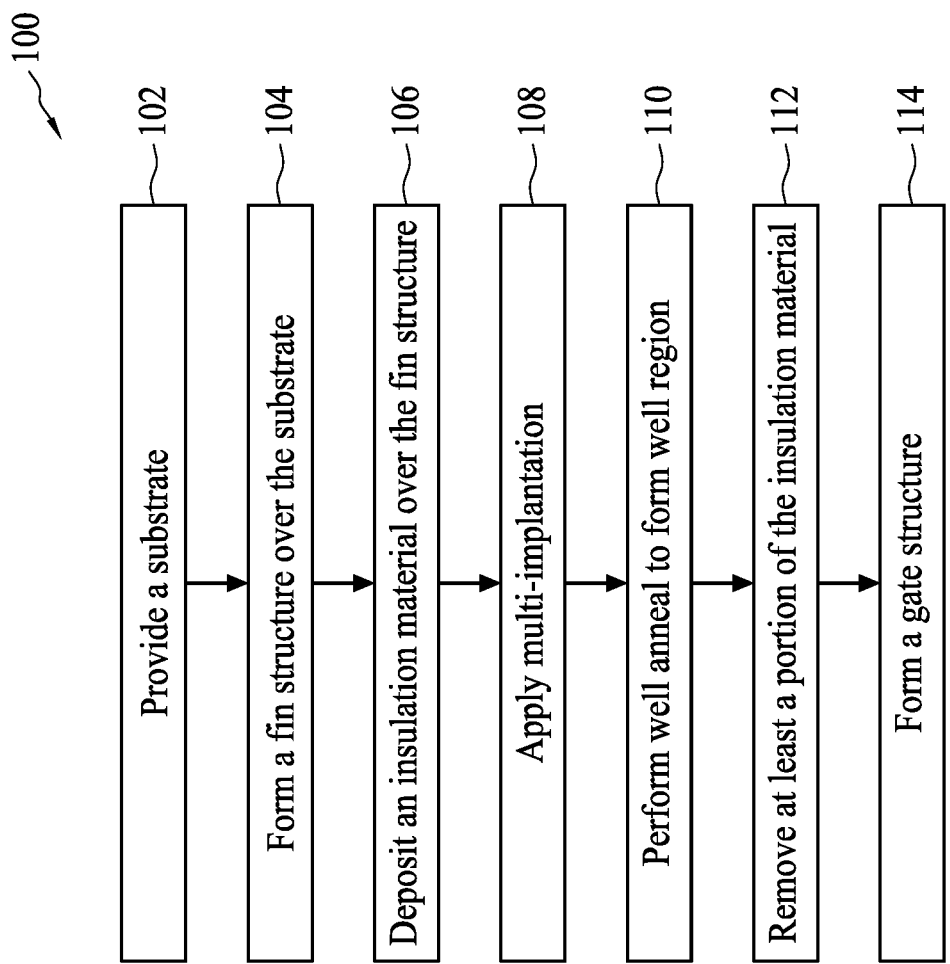
FIG. 1 is a flow chart illustrating a method of fabricating a semiconductor structure, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Multi-gate devices have been introduced in an effort to improve gate control by increasing gate-Channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, ion implantation of dopants through fins of FinFET devices, as done in current fabrication methods, may result in a non-uniform doping profile, which among other issues can cause non-linearity of capacitance of the device. Thus, existing techniques have not proved entirely satisfactory in all respects.

A semiconductor device may perform various digital and analog functions. Some semiconductor device may have analog-rich circuit design, such as image signal processor (ISP). Analog-rich circuit design requires high linearity capacitor through voltage biasing. However, it is hard to provide such high linearity capacitor in fin-based devices.

In a typical process for manufacturing a semiconductor device, doped regions or well regions in a substrate are all formed by implanting ions into the substrate from a surface on which devices are formed and driving-in the ions to form the doped regions and well regions by anneal. However, it is found that the well region may have non-uniform doping profile from the shallow implantation regions to the deep implantation regions after annealing. For example, when the implantation is performed after the fins are formed on the substrate, such non-uniformity becomes more obvious due to such non-planar structure. Since the dopant concentration shows Gaussian distribution with respect to different levels of depth in the target to be implanted, the longer path the ionized dopants have to travel in the target, the more evident the Gaussian distribution can be observed. Such dopant concentration distribution undermines the uniformity of the dopant concentration at predetermined regions through the fin structure and thus reduces the device performance.

Given the above discussion, a fin-based device with a uniformly doped region is desired in achieving improved linearity in capacitance and enhanced device performance.

Examples of devices that can benefit from one or more embodiments of the present invention are semiconductor devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

With reference to FIG. 1 and FIGS. 2 to 9, a method 100 and a semiconductor structure 200 are collectively described below. It is understood that parts of the method 100 and/or the semiconductor structure 200 may be fabricated by a well-known complementary metal-oxide-semiconductor (CMOS) technology process flow, and thus some processes are only briefly described herein. Further, the semiconductor structure 200 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor structure 200 includes a plurality of semiconductor devices (e.g., transistors), which may be interconnected.

The semiconductor structure 200 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof. Moreover, it is noted that the process steps of the method 100, including any descriptions given with reference to FIGS. 2-9, are merely exemplary and are not intended to be limiting beyond what is specifically recited in the claims that follow.

FIG. 1 is a flow chart of a method 100 for manufacturing a semiconductor structure according to various aspects of the present disclosure. In the present embodiment, the method 100 is for manufacturing a semiconductor structure that includes a fin structure. The method 100 includes a number of operations (102, 104, 106, 108, 110, 112, 114 and 116). The method for manufacturing the semiconductor structure 100 will be further described according to one or more embodiments. It should be noted that the operations of the method for manufacturing the semiconductor structure 100 may be rearranged or otherwise modified within the scope of the various aspects. It should further be noted that additional processes may be provided before, during, and after the method 100, and that some other processes may only be briefly described herein. Thus, other implementations are possible within the scope of the various aspects described herein.

FIGS. 2-9 illustrate diagrammatic cross-sectional side views of one embodiment of a semiconductor structure 200 at various stages of fabrication, according to the method 100 of FIG. 1. In some embodiments, a semiconductor structure 200 includes any fin-based device, including double-gate field effect transistor, tri-gate field effect transistor (TGFET), multi-gate field-effect transistor (MuGFET). The semiconductor structure 200 may be included in a microprocessor, memory cell, and/or other integrated circuit device. FIGS. 2-9 have been simplified for the sake of clarity to better understand the inventive concepts of the present disclosure. Additional features can be added in the semiconductor structure 200, and some of the features described below can be replaced or eliminated in other embodiments of the semiconductor structure 200.

The method 100 begins at operation 102 where a substrate 210 is provided or received. In some embodiments, the substrate 210 includes a silicon substrate (e.g., wafer). The substrate 210 may be silicon in a crystalline structure. In other embodiments, the substrate 210 may include other elementary semiconductors such as germanium in a crystalline structure, a compound semiconductor, such as silicon germanium, silicon carbide, gallium arsenic, gallium phosphide, indium phosphide, indium arsenide, and/or indium antimonide; or combinations thereof. In some embodiments, the substrate 210 includes a silicon-on-insulator (SOI) substrate. The SOI substrate may be fabricated using separation by implantation of oxygen (SIMOX), wafer bonding, and/or other suitable methods. The substrate 210 may further include various doped regions and other suitable features. In some embodiments, the substrate 210 can include isolation structures (i.e., shallow trench isolation (STI) structures) (not shown) interposing regions accommodating different devices.

In some embodiments, an anti-punch through (APT) dopant implantation process may be performed to form an APT region (not shown) in the substrate 210, The APT region may be an n-type APT region or a p-type APT region. By way of example, a p-type dopant implanted into the p-type APT region may include boron, aluminum, gallium, indium, or other p-type acceptor material; and an n-type dopant implanted via the ion implantation process into the n-type APT region may include arsenic, phosphorous, antimony, or other n-type donor material. It will be understood that the APT dopant implantation steps may be performed in any order, for example, the n-type APT region may be implanted before or after the p-type APT region. Further, when performing the APT dopant implantation, for the p-type APT region, a patterned resist layer can be formed to protect the n-type ATP region. Similarly, another patterned resist layer can be formed to protect the p-type ATP region when performing the APT dopant implantation for the n-type APT region. After the ion implantation processes, the patterned resist layers may be removed, for example, by way of a solvent, resist stripper, asking, or other suitable technique. Additionally, in various embodiments, an APT implant may have a high dopant concentration, for example, of between about $1\times10$ cm$^{-3}$ and $1\times10^{19}$ cm$^{-3}$.

In some embodiments, a dielectric layer may be formed over the substrate 210 and serve as a pad layer. The dielectric pad layer can be formed by any suitable process to any suitable thickness. In some embodiments, the dielectric pad layer includes silicon oxide and is formed by a CVD or a thermal oxidation process. The thermal oxidation process may be a dry or a wet process. In various examples, the silicon oxide can be formed by physical vapor deposition (PVD), atomic layer deposition (ALD), high density plasma. CVD (HDPCVD), other suitable methods, and/or combinations thereof. The CVD process, for example, may use chemicals including hexachlorodisilane (HCD or $Si_2Cl_6$), dichlorosilane (DCS or $SiH_2C_{12}$), bis(tertiarybutylamino) silane (BTBAS or $C_8H_{22}N_2Si$) and disilane (DS or $Si_2H_6$).

A mask layer is then formed over the dielectric pad layer. In some embodiments, the mask layer includes silicon nitride and is formed by a CVD process. The mask layer may be a stop/hard mask layer. The mask layer can be formed by any suitable process to any suitable thickness. The mask layer may include a material such as silicon nitride, silicon oxide, silicon oxynitride, silicon carbide, silicon carbon nitride, other suitable material, or combinations thereof. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including hexachlorodisilane (HCD or $Si_2Cl_6$), dichlorosilane (DCS or $SiH_2C_{12}$), bis(tertiarybutylamino) silane (BTBAS or $C_8H_{22}N_2Si$) and disilane (DS or $Si_2H_6$). A photoresist layer may be formed over the mask layer. The photoresist layer is formed by any suitable process to any suitable thickness.

At operation 104, a fin structure 212 is formed over the substrate 210. In an embodiment, the fin structure 212 is a silicon fin (Si-fin). The layer of silicon may be a silicon layer of an SOI substrate. The fin structure 212 may have a height ranging from about 20 nm to about 100 nm. In sine embodiments, the height ranges from about 50 nm to about 70 nm.

The fin structure 212 may be formed by any suitable process, such as a photolithography and etching process. In some embodiments, the fin structure 212 is formed by exposing the photoresist layer to a pattern, performing a post-exposure bake process, and developing the photoresist layer to for a masking element. The photoresist layer patterning may include processing steps of photoresist coating, soft baking, mask aligning, exposing pattern, post-exposure baking, developing photoresist, and hard baking. The patterning may also be implemented or replaced by other proper methods, such as maskless photolithography, electron-beam writing, ion-beam writing, and molecular imprint.

Figure 2:
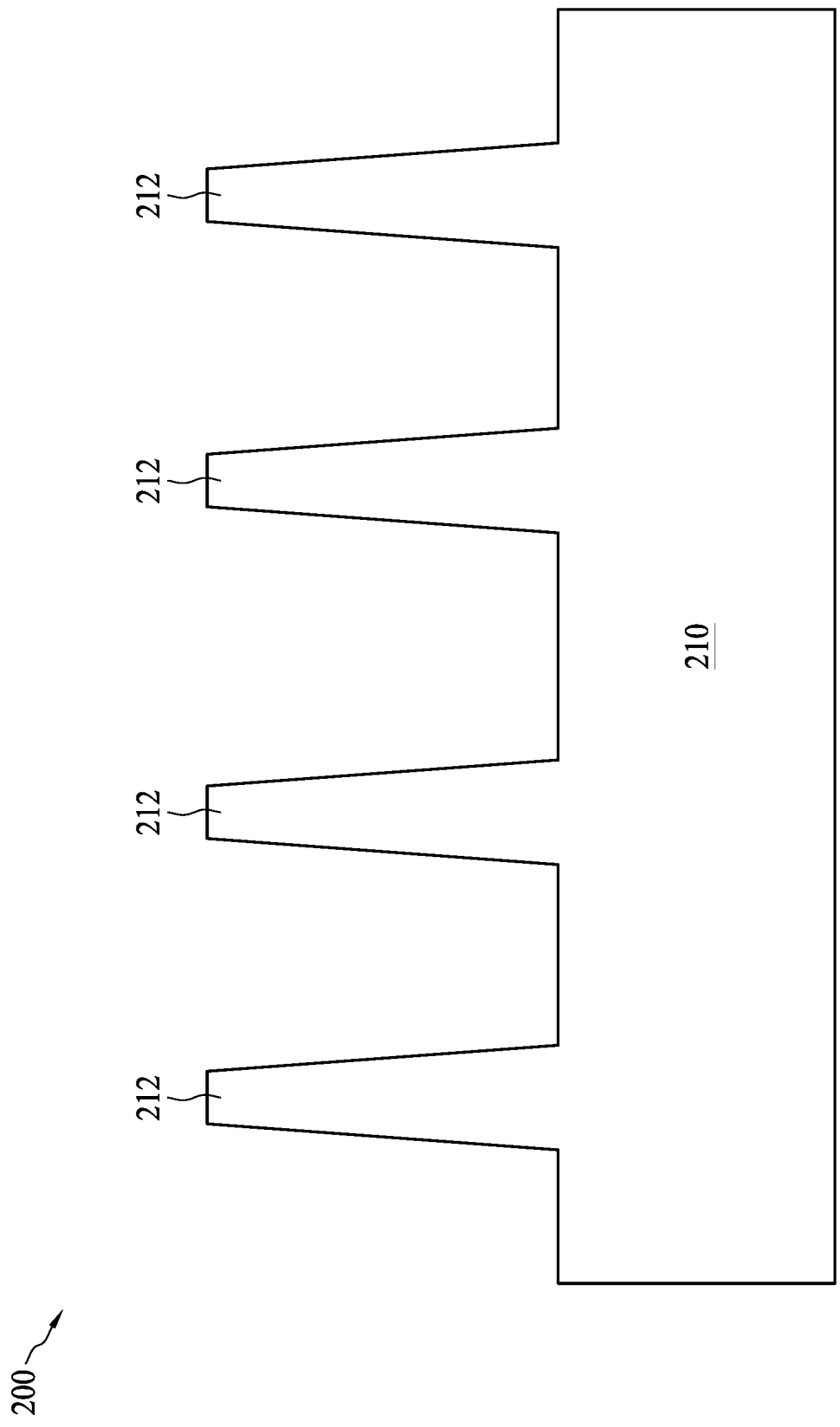
FIGS. 2-9 illustrate diagrammatic cross-sectional side views of one embodiment of a semiconductor structure at various stages of fabrication, according to the method of FIG. 1.

In some embodiments, the masking element may be transferred to the mask layer and the dielectric pad layer. Such that a patterned mask is obtained. In some embodiments, the patterned mask layer is used in an etching process to etch the substrate 210. Accordingly, the fin structure 212 is formed over the substrate 210, as shown in FIG. 2. The etching process uses the patterned mask layer to define the area to be etched and to protect other regions of the FinFET device. The etching process may include a wet etching process, a dry etching process, or a combination thereof.

In some embodiments, the fin structure 212 may be formed by an etching process using a reactive ion etch (RIE) and/or other suitable process. In one example, a hydrofluoric acid (HF) or buffered HF may be used to etch the dielectric pad layer to expose the substrate 210 according to the pattern defined by the mask layer. In one example, a dry etching process used to etch the substrate 210 includes a chemistry including fluorine-containing gas. In a further example, the chemistry of the dry etch includes $CF_4$, $SF_6$, or $NF_3$. Alternatively, the fin structure 212 is formed by a double-patterning lithography (DPL) process. DPI, is a method of constructing a pattern on a substrate 210 by dividing the pattern into two interleaved patterns. DPL allows enhanced feature (e.g., fin) density. Various DPL methodologies may be used, including, double exposure (e.g., using two mask sets), forming spacers adjacent features and removing the features to provide a pattern of spacers, resist freezing, and/or other suitable processes. It is understood that multiple parallel fin structures may be formed in a similar manner.

Figure 3:
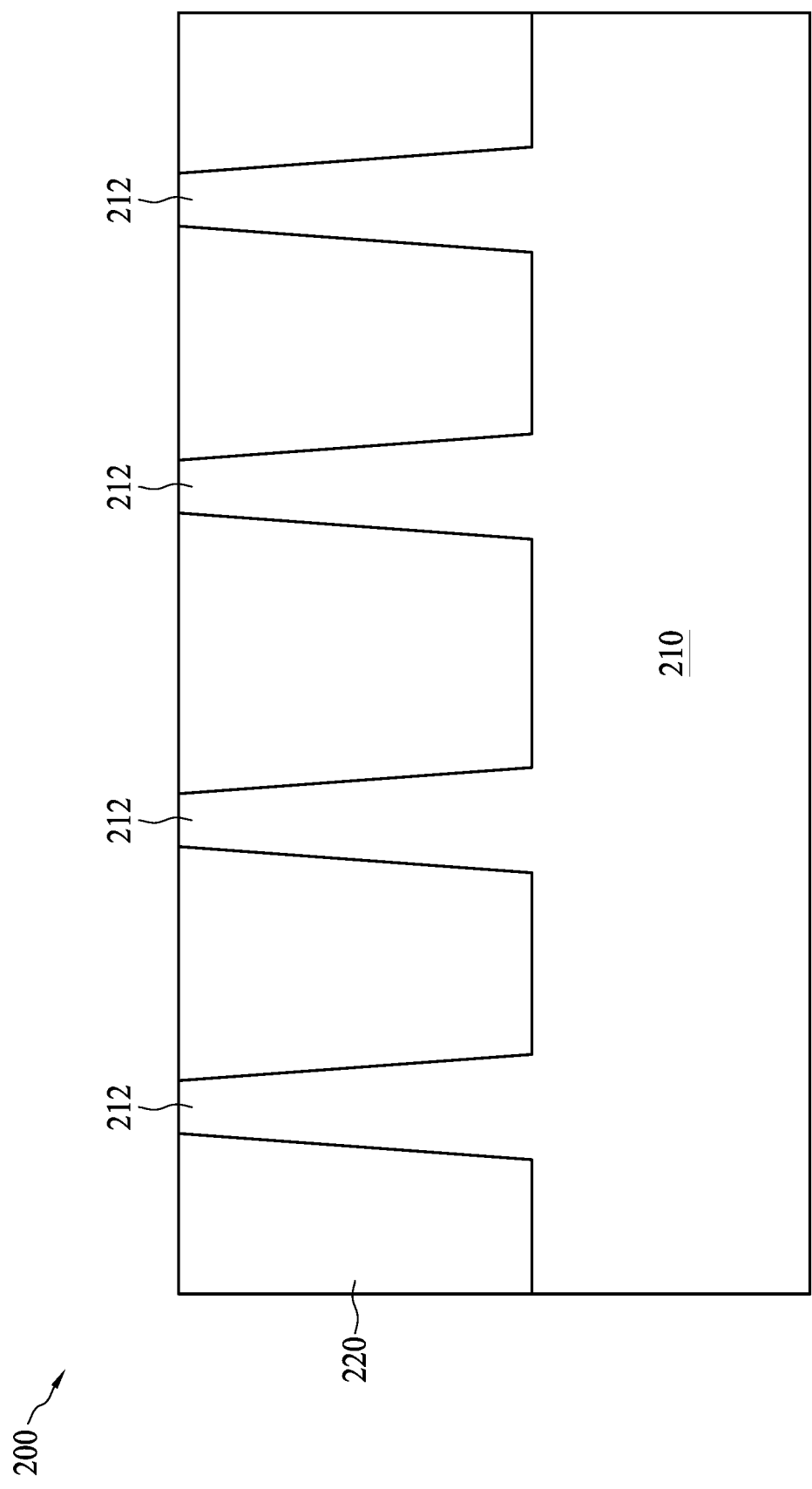

The method 100 then proceeds to operation 106 where an insulation material 220 is deposited over the fin structure 212. The insulation material 220 may be deposited such that it covers the fin structure 212. In one embodiment, the insulation material 220 includes silicon oxide. The silicon oxide can be deposited by a CVD process. In various examples, the silicon oxide can be formed by physical vapor deposition (PVD), atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner may be grown to improve the trench interface. The CVD process, for example, may use chemicals including hexachlorodisilane (HCD or $Si_2Cl_6$), dichlorosilane (DCS or $SiH_2Cl_2$), bistTertiarybutylamino) silane (BTBAS or $C_8H_{22}N_2Si$) and disilane (DS or $Si_2H_6$). A planarizing process may be performed such that the top surface of the insulation material 220 is planarized. In some embodiments, the top of the fin structure 212 may be exposed. The planarizing process includes a chemical mechanical polishing (CMP) process applied to the FinFET device to remove excessive portions of the insulation material. Referring to FIG. 3, in some embodiments, top surface of the fin structure 212 can be aligned with a top surface of the insulation material 220, but the disclosure is not limited thereto.

The method 100 continues with operation 108 where a multi-implantation 300 is applied to the fin structures 212 and the insulation material 220, using suitable dopants, such as p-type dopants (e.g., boron or indium) and/or n-type dopants (e.g., arsenic or phosphorous). In some embodiments, the multi-implantation 300 can be referred to a plurality of ions implantation cycles performed in-situ. In some embodiments, an in-situ multi-implantation comprises performing the plurality of ion implantation cycles in a vacuum chamber without releasing the vacuum. In some embodiments, each of the ion implantation cycles is conducted with an implantation energy from about 10 KeV to about 70 KeV, but the disclosure is not limited thereto. In some embodiments, each of the ion implantation is conducted with an implantation dose from about $1E15$ atm/cm$^2$ to about $5E15$ atm/cm$^2$, but the disclosure is not limited thereto. In some embodiments, the implantation dose in each ion implantation can be the same. In some alternative embodiments, the implantation dose may be increased or decreased stepwise. The dopants used in each of the ion implantation cycles include any suitable dopants, such as p-type dopants (e.g., boron or indium) and/or n-type dopants (e.g., arsenic or phosphorous). In some embodiments, each of the ion implantation cycles may be conducted at a constant temperature. For example, each implantation may be conducted at room temperature. In some alternative embodiments, the implantation cycles may be conducted in a stepwise increased or decreased temperature. Each of the ion implantation cycles may be performed with a tilt angle with respect to the vertical axis, in a range from about 5° to about 70°. For example in some embodiments, the tilt angle is from about 15° to about 50°, but the disclosure is not limited thereto. In some embodiments, the tilt angle in each ion implantation can be the same. In some alternative embodiments, the tilt angle may be increased or decreased stepwise.

In some embodiments, the multi-implantation 300 includes at least two ion implantation cycles. In some embodiments, the two ion implantation cycles may be performed with substantially identical energy. In other embodiments, the multi-implantation 300 includes four ion implantation cycles with substantially identical energy. For example, each of the four ion implantation cycles is applied with an implantation energy of about 20 KeV, but the disclosure is not limited thereto.

In some embodiment, the multi-implantation 300 may include two ion implantation cycles with stepwise increased or decreased energy. For example, the applied energy at the first ion implantation is from about 40 KeV to about 70 KeV such that a first implanted region in the fin structure is formed; and the applied energy at the second ion implantation is from about 10 KeV to about 40 KeV such that a second implanted region is formed. For example, the applied energy at the first ion implantation is from about 40 KeV to about 70 KeV at room temperature with a tilt angle from about 15° to about 50°; and the applied energy at the second ion implantation is from about 10 KeV to about 40 KeV at room temperature with a tilt angle from about 15° to about 50°. For example, the applied energy at the first ion implantation is from about 40 KeV to about 70 KeV at room temperature with a tilt angle from about 15° to about 30°; and the applied energy at the second ion implantation is from about 10 KeV to about 40 KeV at room temperature with a tilt angle from about 30° to about 50°. In some embodiments, the first implantation region in the fin structure is deeper than the second implantation region. For example, the first implantation region is located at a depth (from top to bottom) of about 30% to about 50% of the fin structure 212 and the second implantation region is located at a depth of about 30% or less of the fin structure 212.

Figure 4:
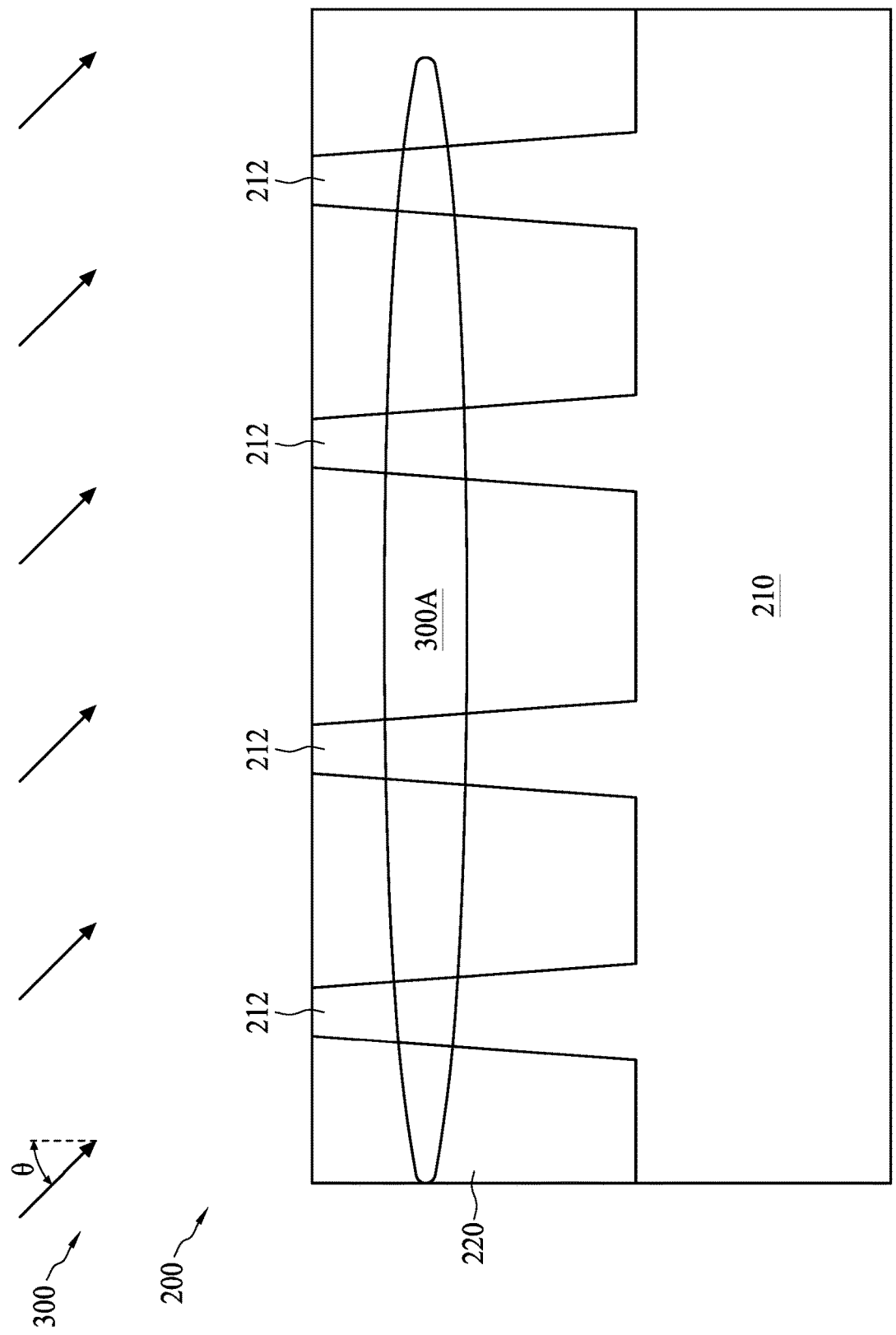
Figure 5:
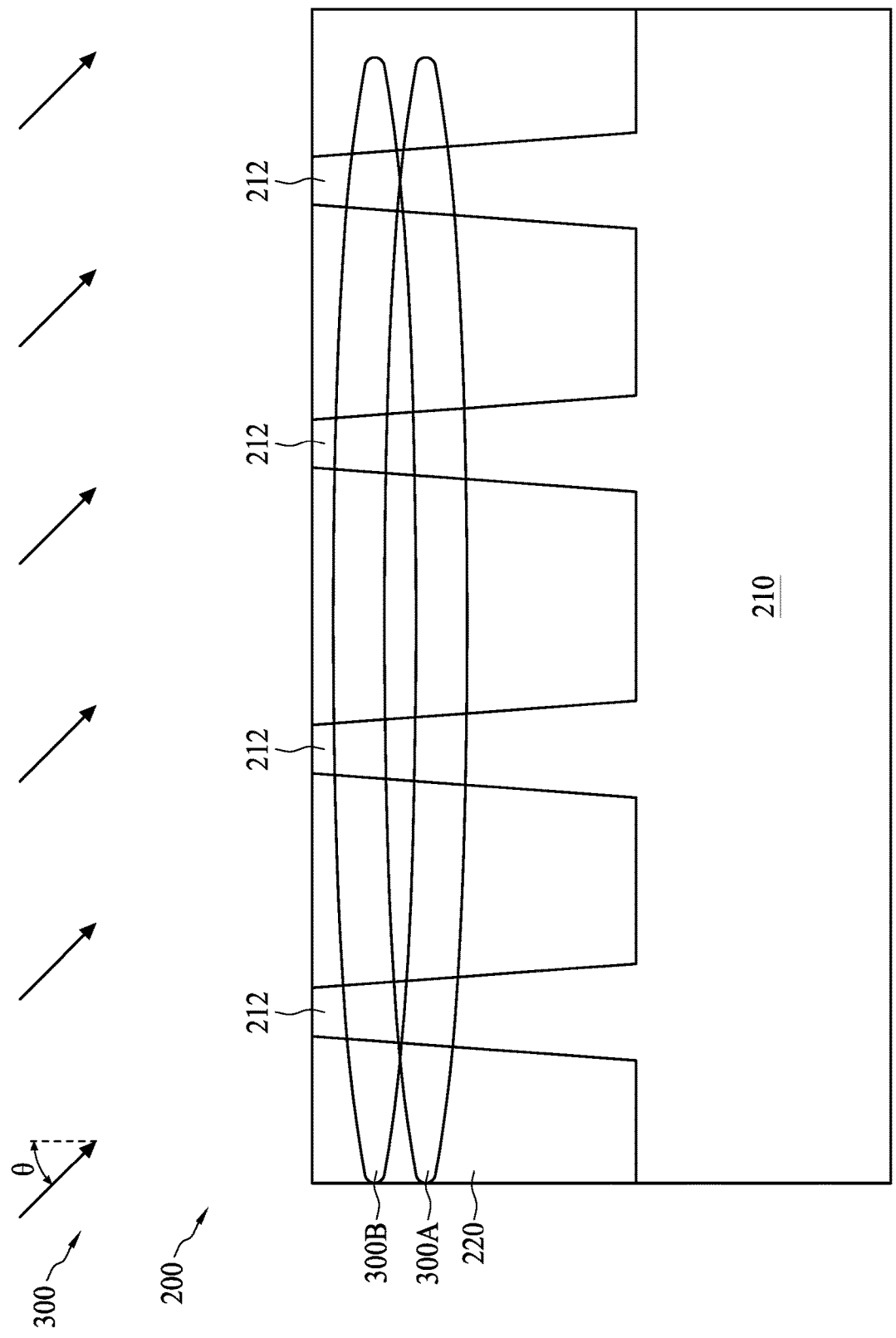
Figure 6:
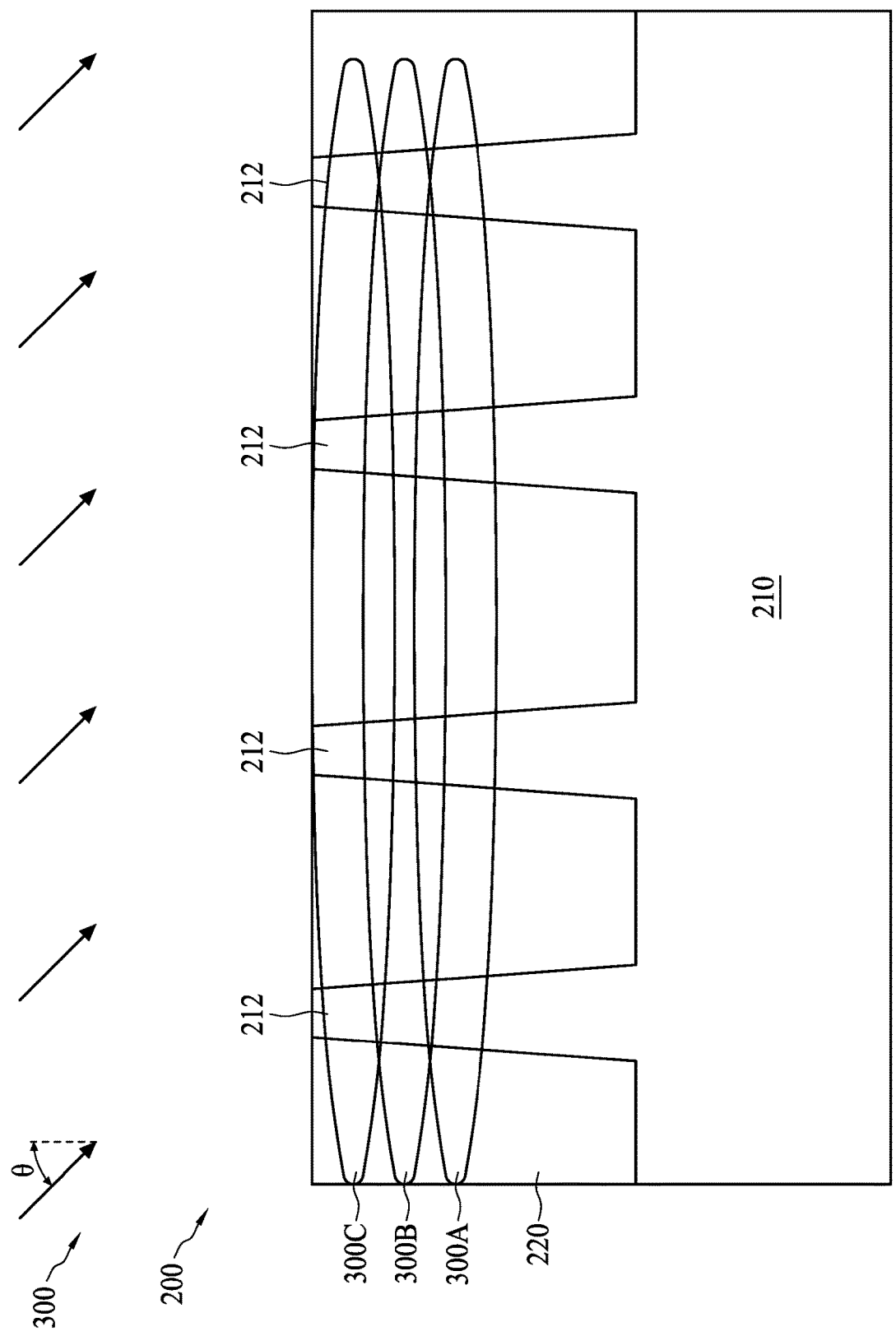

For example, in a multi-implantation 300 including three ion implantation cycles, the applied energy at the first ion implantation is from about 40 KeV to about 70 KeV, such that a first implanted region 300A is formed, as shown in FIG. 4. The applied energy at the second ion implantation t is from about 20 KeV to about 40 KeV, such that a second implanted region 300B is formed, as shown in FIG. 5. The applied energy at the third ion implantation is from about 10 KeV to about 20 KeV, such that a third implantation region 300C is formed, as shown in FIG. 6. For example, the applied energy at the first ion implantation is from about 40 KeV to about 70 KeV at room temperature with a tilt angle from about 15° to about 50°; the applied energy at the second ion implantation is from about 20 KeV to about 40 KeV at room temperature with a tilt angle from about 15° to about 50°; and the applied energy at the third ion implantation is from about 10 KeV to about 20 KeV at room temperature with a tilt angle from about 15 to about 50°. For example, the applied energy at the first ion implantation is from about 40 KeV to about 70 KeV at room temperature with a tilt angle from about 5° to about 20°; the applied energy at the second ion implantation is from about 25 KeV to about 40 KeV at room temperature with a tilt angle from about 20° to about 40°; and the applied energy at the second ion implantation is from about 10 KeV to about 20 KeV at room temperature with a tilt angle from about 40° to about 70°.

In some embodiments, the first implanted region 300A as shown in FIG. 4 is located at a depth (from top to bottom) of about 35% to about 50% of the fin structure 212, the second implantation region 300B is located at a depth of about 15% to about 35% of the fin structure 212 and the third implantation region 300C is located at a depth of about 15% or less of the fin structure 212.

Figure 7:
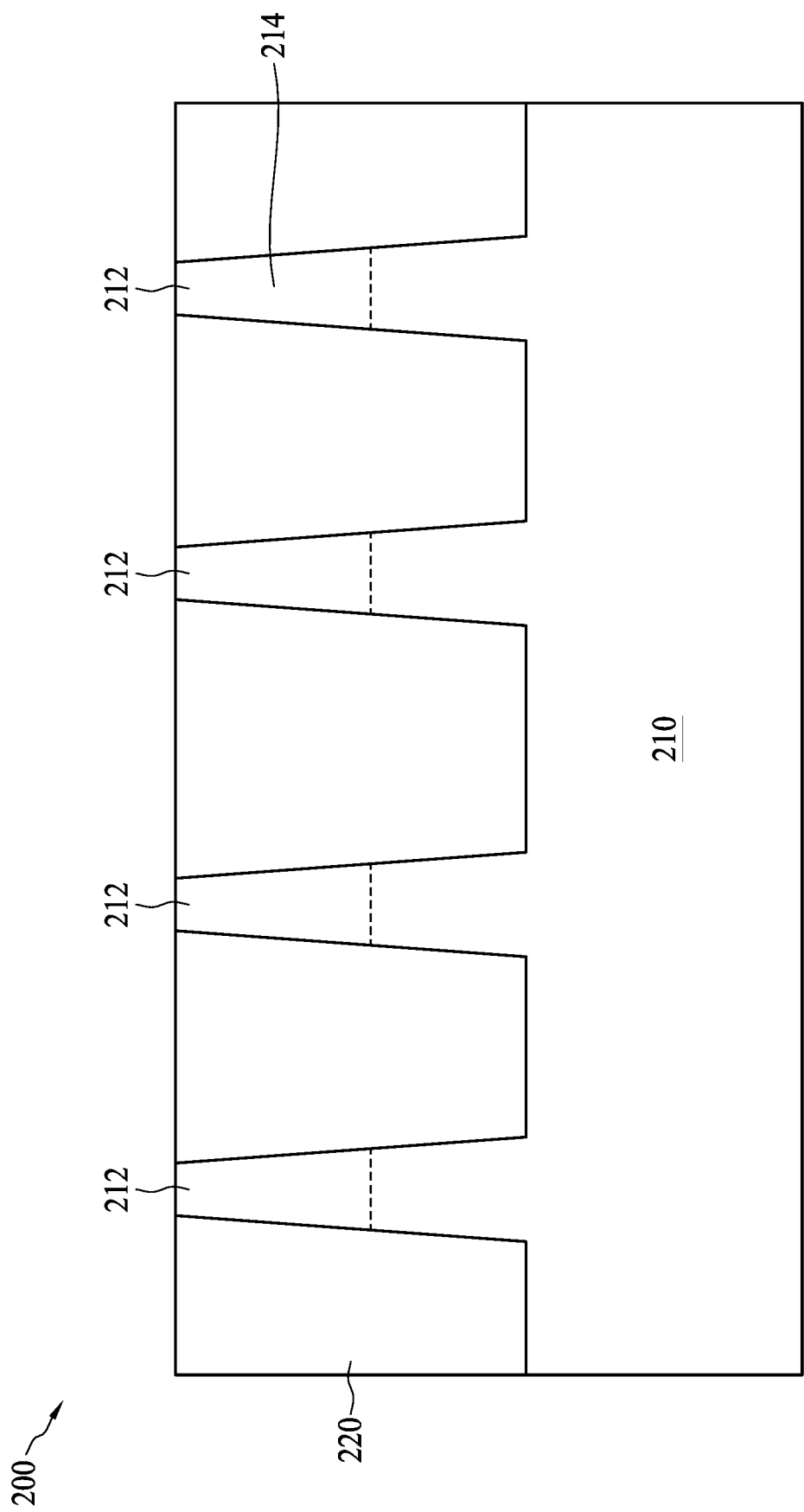

The method 100 then proceeds to operation 110 where a well anneal is performed at a temperature above approximately 1000° C. In one embodiment, the well anneal may be performed between about 1000° C. to about 1100° C. In some examples, the well anneal may be performed for a duration of few seconds, such as about 10 s. While some examples of annealing temperature and duration have been given, these examples are merely exemplary and are not meant to be limiting in any way. Other annealing temperatures and/or durations may also be used in accordance with various process conditions and/or device requirements, as known in the art. Consequently, a well region 214 is formed in each of the fin structure 212 as shown in FIG. 7.

As discussed above, the dopant concentration shows Gaussian distribution with respect to different levels of depth in the target to be implanted. Applying implantation several times with substantially identical energy or different energy levels provides the fin structure 212 with uniform doping profile after annealing.

Figure 8:
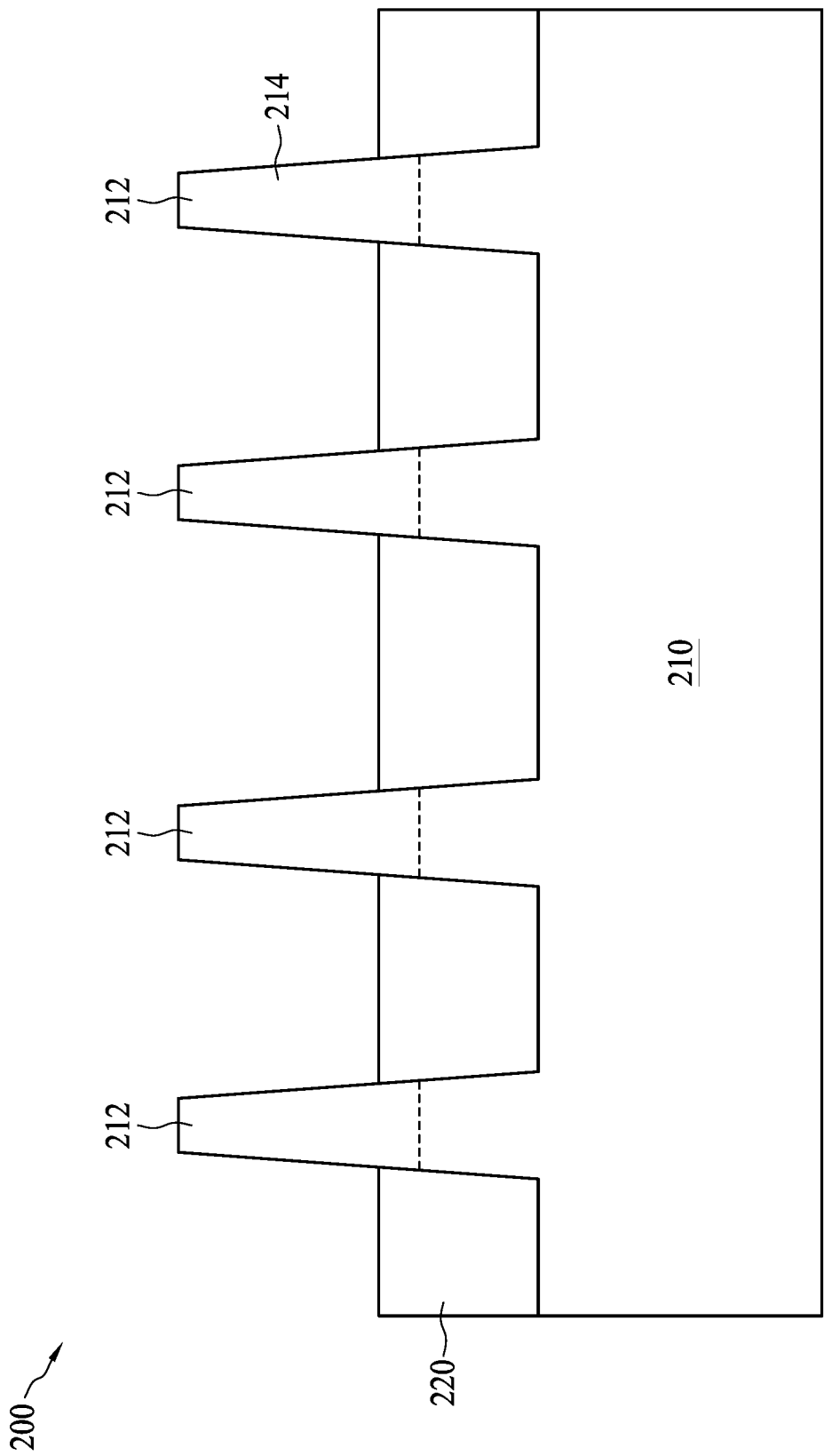
Figure 9:
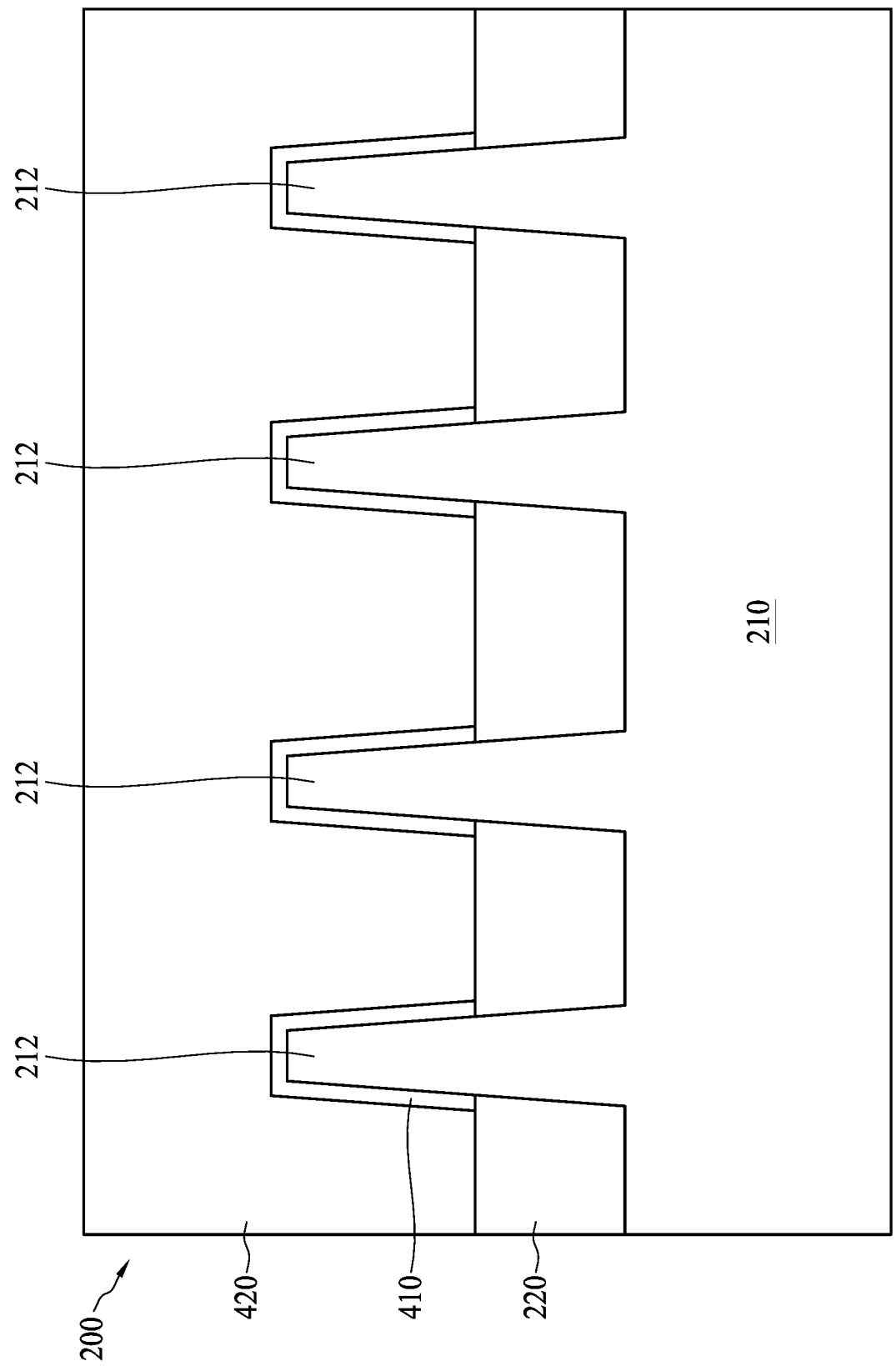

At operation 112, at least a portion of the insulation material 220 is removed to expose a portion of the fin structure 212. In one embodiment, the at least a portion of the insulation material may be removed by an etching process, which includes etching back the insulation material such that the sidewalk of the fin structure 212 are exposed, as shown in FIG. 8. It should be noted that during the multi-implantation 300, a portion of the insulating material 230 may be damaged. However, those portions damaged by the multi-implantation 300 may be removed at operation 112. Consequently, adverse impact to the remained insulation material can be mitigated.

At operation 114, in which a gate structure is formed over a portion of the fin structure 212. The gate structure includes a gate dielectric layer 410 and a gate electrode 420. In an embodiment, the gate dielectric layer 410 may include silicon oxide. The silicon oxide may include a thickness ranging from about 1 to about 3 nm. In other embodiments, the gate dielectric layer 410 may optionally include other dielectric materials such as, silicon nitride, silicon oxynitride, dielectric with a high dielectric constant (high k), and/or combinations thereof. Examples of high k materials include hafnium silicate, hafnium oxide, zirconiwn oxide, aluminum oxide, hafnium dioxide-alumina ($HfO_2$—$Al_2O_3$) alloy, and/or combinations thereof. The gate dielectric layer may be formed using processes such as, photolithography patterning, oxidation, deposition, etching, and/or other suitable processes. The gate electrode 420 may include polysilicon, silicon-germanium, a metal including metal compounds such as, Mo, Cu, W, Ti, Ta, TaN, NiSi, CoSi, and/or other suitable conductive materials known in the art. The gate electrode 420 may be formed using processes such as, physical vapor deposition (PVD), chemical vapor deposition (CVD), plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

In some embodiments, the method 100 may continue to provide steps of fabricating other features of semiconductor elements, including, for example, forming contact, interconnect structures, and/or other suitable processes and features. In one embodiment, the protection layer may be removed. In other embodiments, the protection layer may remain over the fin structure in the final device.

Additional steps can be provided before, during, and after the method 100, and some of the steps described can be replaced or eliminated for other embodiments of the method. The discussion that follows illustrates various embodiments of a semiconductor structure that can be fabricated according to the method 100 of FIG. 1.

FIGS. 10-19 illustrate diagrammatic cross-sectional side views of one embodiment of a semiconductor structure 200 at various stages of fabrication, according to the method 100 of FIG. 1. It should be noted that similar elements in FIGS. 2-9 and FIGS. 10-19 are designated by the same numerals, and can include similar materials, therefore those details are omitted in the interest of brevity. In some embodiments, a semiconductor structure 200 includes any fin-based device, including double-gate field effect transistor, tri-gate field effect transistor (TGFET), multi-gate field-effect transistor (MuGFET). FIG. 20 illustrates a perspective view of one embodiment of a fin-based device. The semiconductor structure 200 may be included in a microprocessor, memory cell, and/or other integrated circuit device. FIGS. 10-19 have been simplified for the sake of clarity to better understand the inventive concepts of the present disclosure. Additional features can be added in the semiconductor structure 200, and some of the features described below can be replaced or eliminated in other embodiments of the semiconductor structure 200.

Figure 10:
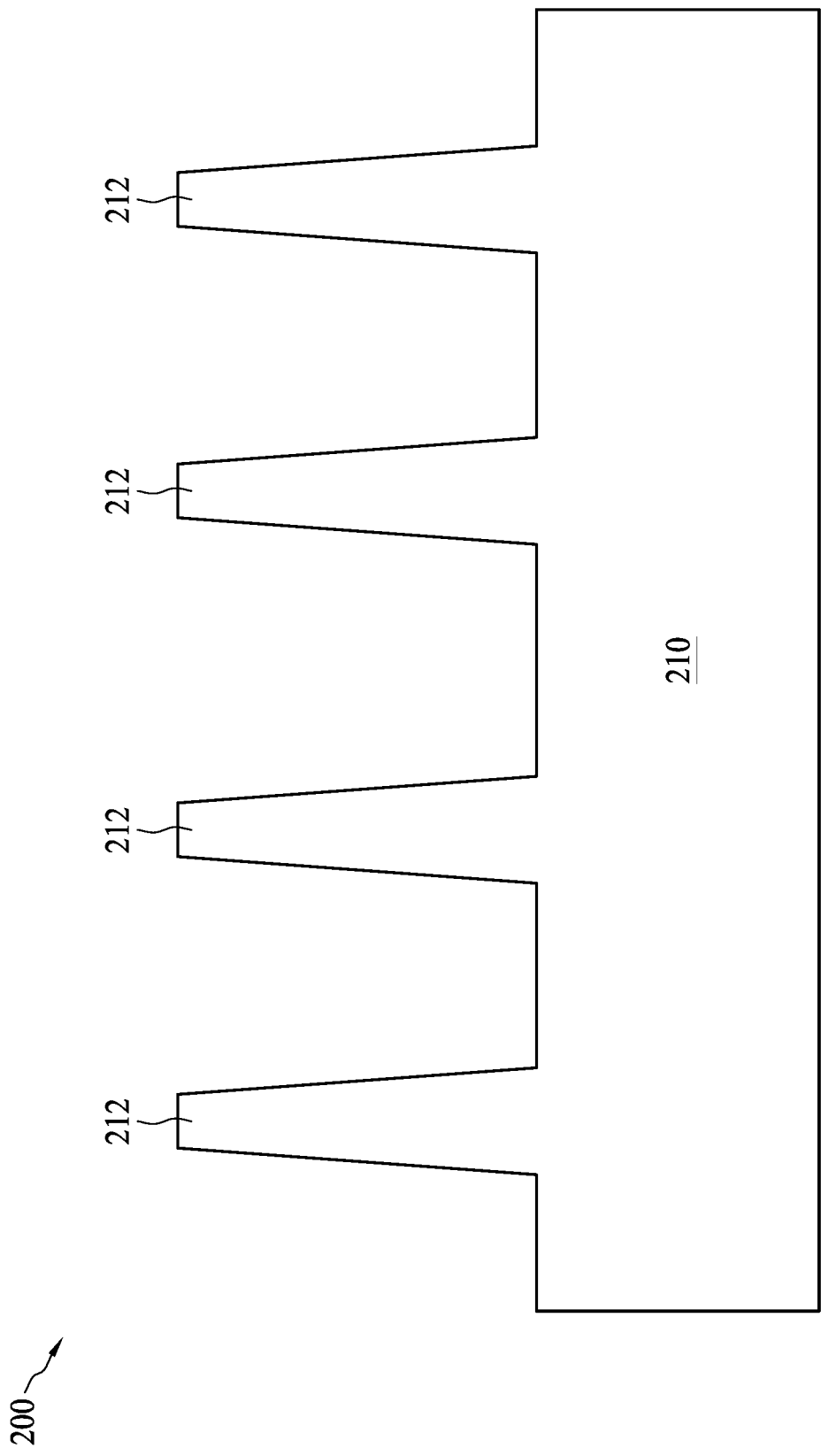
FIGS. 10-19 illustrate diagrammatic cross-sectional side views of another embodiment of a semiconductor structure at various stages of fabrication, according to the method of FIG. 1.

Referring to FIG. 10, at operation 102, a substrate (e.g., wafer) 210 is provided or received, and a fin structure 212 (including a plurality of fins each having first and second sidewalls) is formed over the substrate 210 at operation 104. The substrate 210 is a bulk silicon substrate. Alternatively, the substrate 210 comprises an elementary semiconductor, such as silicon or germanium in a crystalline structure.

As mentioned above, the substrate 210 may have an anti-punch-through (APT) layer. In some embodiments, the APT layer may be a semiconductor layer comprising APT dopants suitable for preventing source/drain punch through in n-type devices. For example, the APT layer may comprise silicon carbon boron (SiCB), silicon boron (SiB), and the like. In embodiments when the APT layer comprises SiCB, the carbon atoms may prevent (or at least reduce) the diffusion of APT dopants (e.g., boron) into surrounding device layers. In such embodiments, an atomic concentration of C in APT layer may be about 0.5% to about 1%. Furthermore, the APT layer may have a thickness of about 3 nm to about 10 nm. In one embodiment, the APT layer may be formed before the fin structure 212 is formed on the substrate 210.

The fin structure 212 is formed on the substrate 210 by any suitable process, such as a photolithography and etching process. The fin structure 212 includes one or more fins each having first and second sidewalls. In an embodiment, the fin structure 212 includes silicon. In other embodiments, the fin structure 212 may optionally include germanium. In an embodiment, the fin structure 208 may be disposed on the insulator layer. The fin structure 212 may have a depth ranging from about 20 nm to about 100 nm. In one embodiment, the depth ranges from about 50 nm to about 70 nm.

Figure 11:
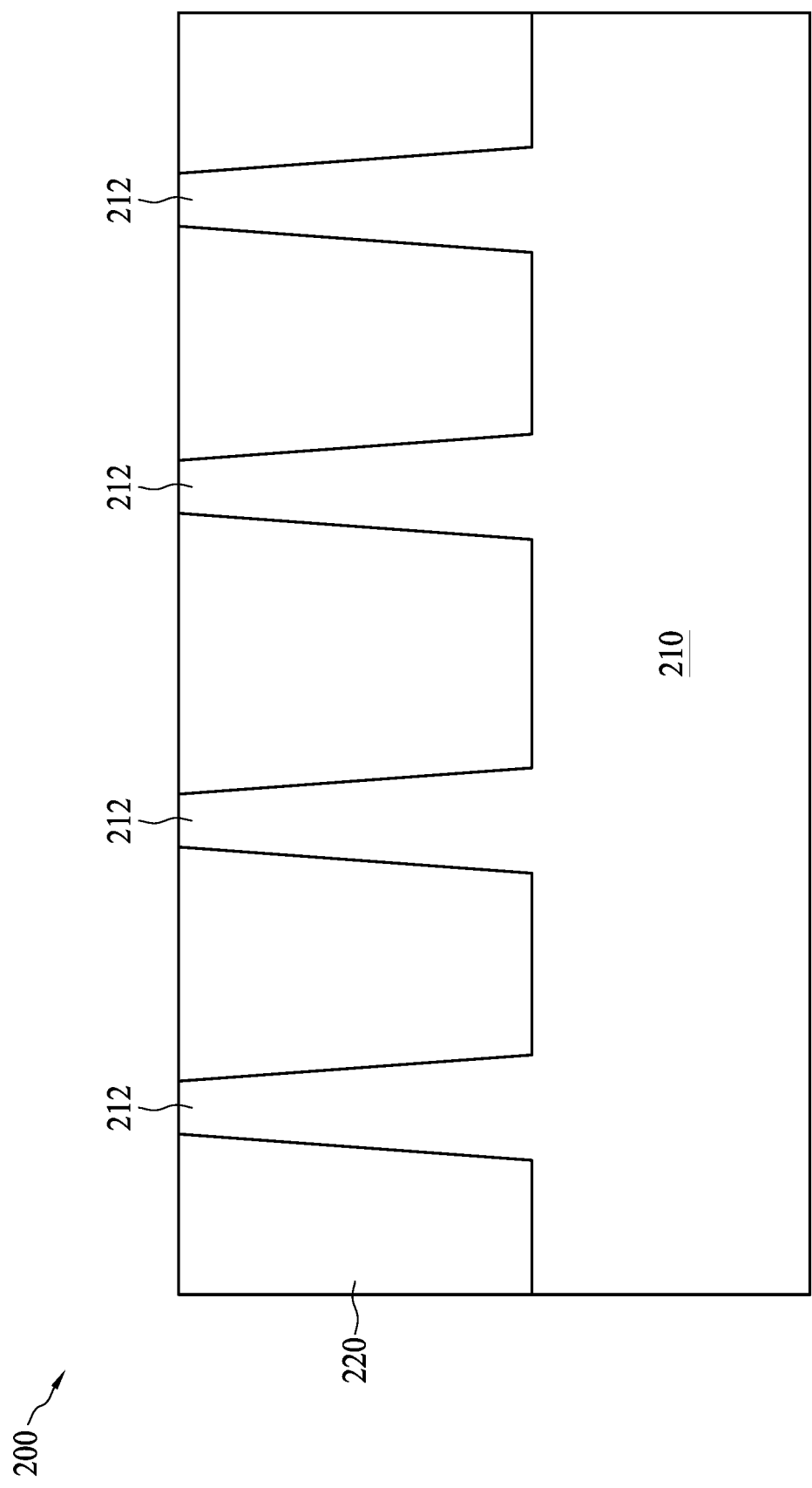

At operation 106, with further reference to FIG. 11, deposited over the substrate 210 (and over the fin structure 212) is an insulation material 220. The insulation material 220 is deposited such that the insulation material 220 surrounds and isolates the fins from each other. The insulation material 220 may include an insulating material such as silicon oxide, silicon nitride, silicon oxynitride, low k materials, air gap, other suitable material, or combinations thereof. The insulation material 220 may have a multi-layer structure, for example, a thermal oxide liner layer with silicon nitride formed over the substrate. The top surface of the insulation material 220 may be planarized with a planarizing process. In one embodiment, the top portion of the fin structure may be exposed.

Figure 12:
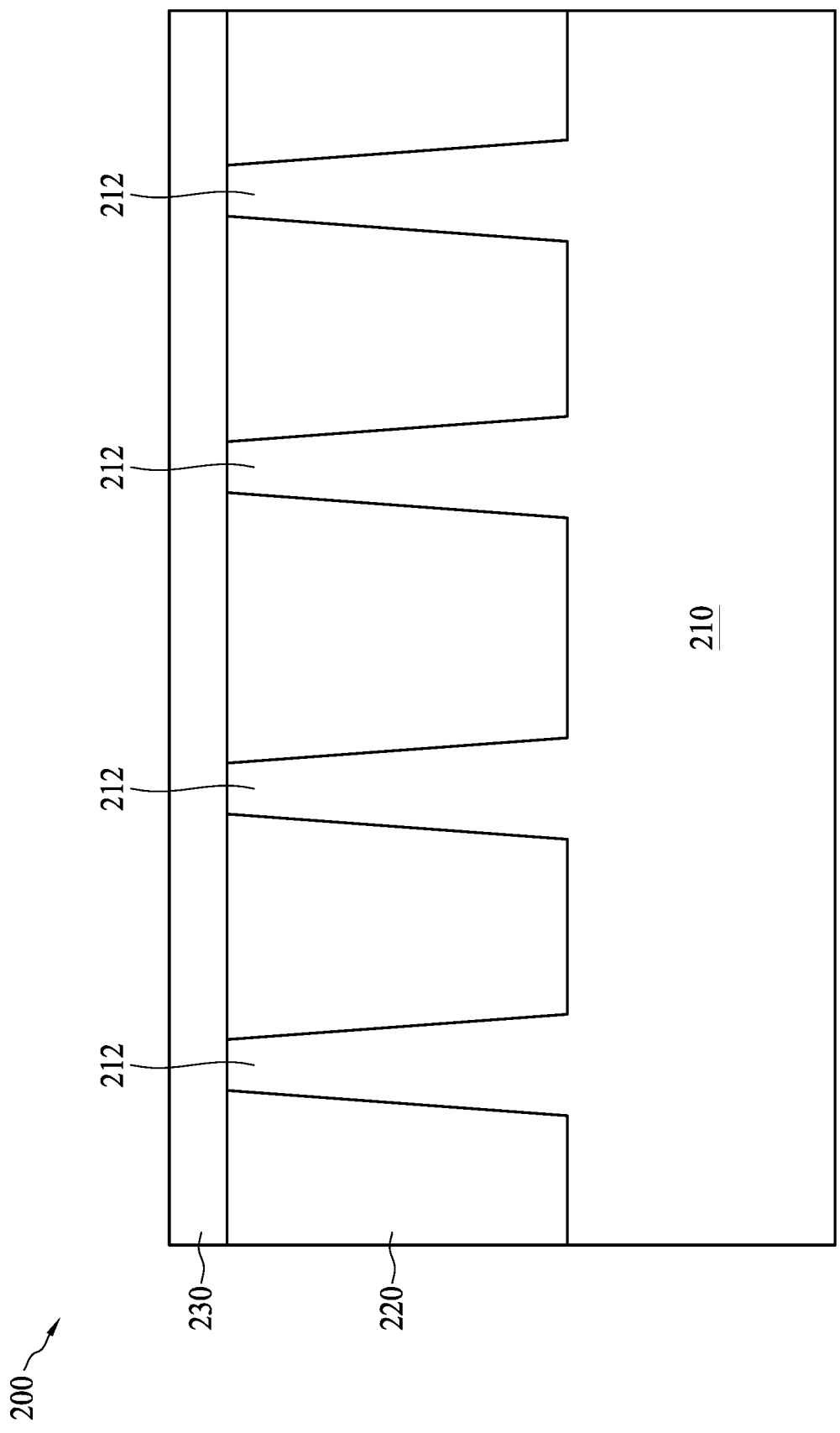

As shown in an example of FIG. 12, in some embodiments, a sacrificial layer 230 may be formed on the top of each fin structure 212; or formed on the top of each fin structure 212 or also onto the insulation material 220 as shown in FIG. 12. The sacrificial layer 230 may be a silicon oxide layer, which is used to protect the fin structure 212 against any damages (such as crystal damage) generated due to the following multi-implantation processes, so as to ensure high device performance. The thickness of the sacrificial layer 230 is from about 40 Å to about 80 Å, but the disclosure is not limited thereto. In on example, the thickness of the sacrificial oxide 230 is about 60 Å, but the embodiments are not limited thereto. In some comparative approaches, when the thickness of the sacrificial layer 230 is less than 40 Å, it may not be thick enough to protect the fin structure 212. In other comparative approaches, when the thickness of the sacrificial layer 230 is greater than 80 Å, it may too thick to block the following multi-implantation.

Figure 13:
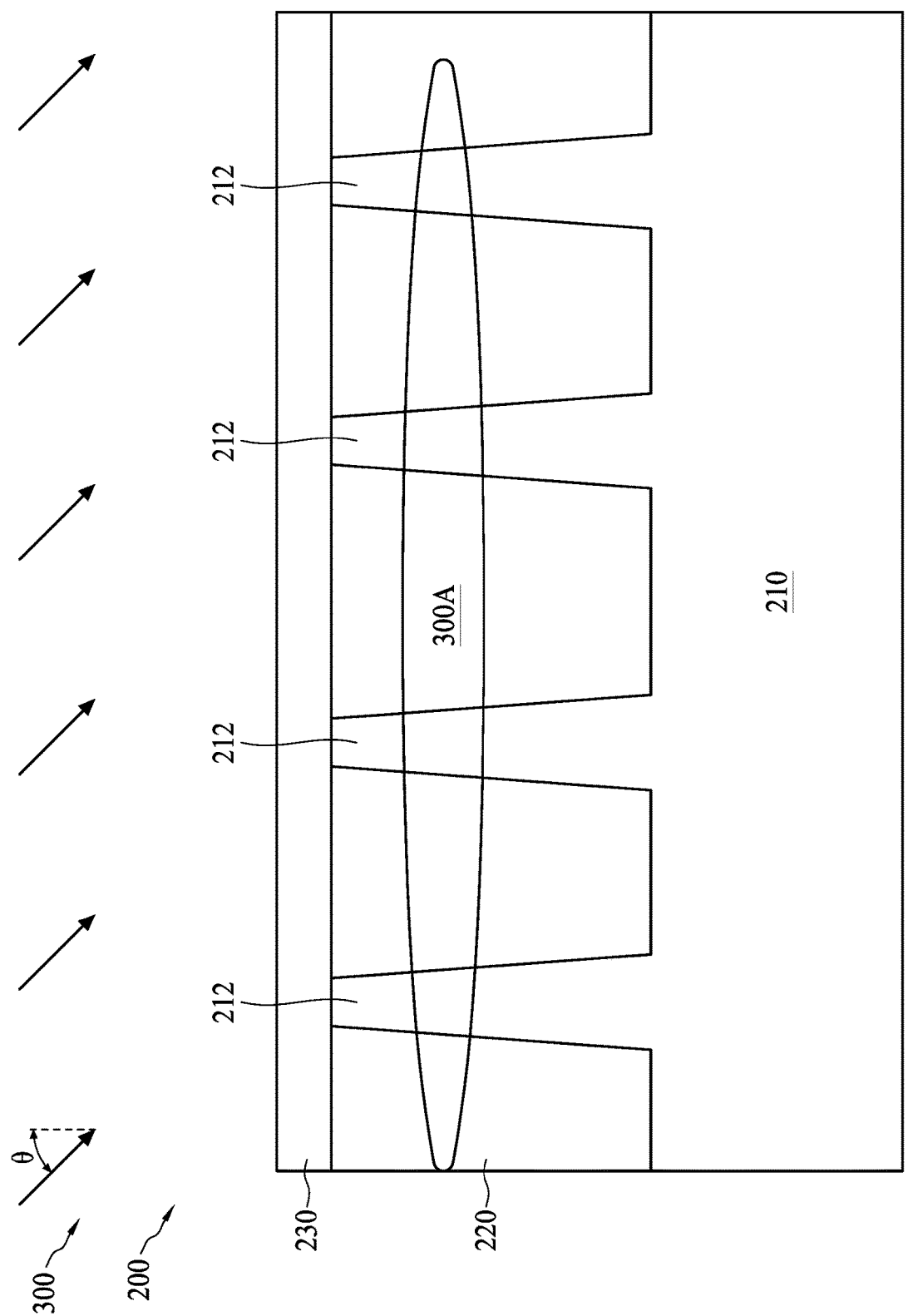

With further reference to FIG. 13, a multi-implantation 300 is applied to the fin structures 212 and the insulation material 220 at operation 108. The multi-implantation 300 can be referred to a plurality of ions implantation cycles performed in-situ. In some embodiment, implantation energy of each of the ion implantation cycles is from about 10 KeV to about 70 KeV, but the disclosure is not limited thereto. In some embodiments, an implantation dose of each of the ion implantation cycles is from about 1E15 $atm/cm^2$ to about 5E15 $atm/cm^2$, but the disclosure is not limited thereto. The implantation dose in each ion implantation may be the same. In some embodiments, the implantation dose may be increased or decreased stepwise. The dopants used in each of the ion implantation cycles include any suitable dopants, such as p-type dopants (e.g., boron or indium) and/or n-type dopants (e.g., arsenic or phosphorous). In some embodiments, each of the ion implantation cycles may be conducted in a constant temperature. For example, each implantation may be conducted at room temperature. Each ion implantation may be a tilt implantation, which is performed at a tilt angle θ with respect to the vertical axis from about 5° to about 70°. For example in some embodiments, the tilt angle θ is from about 15° to about 50°, but the disclosure is not limited thereto.

In some embodiments, the multi-implantation 300 may include at least two ion implantation cycles applied with substantially identical energy. In some embodiments, the multi-implantation 300 may include four ion implantation cycles applied with substantially identical energy.

Figure 14:
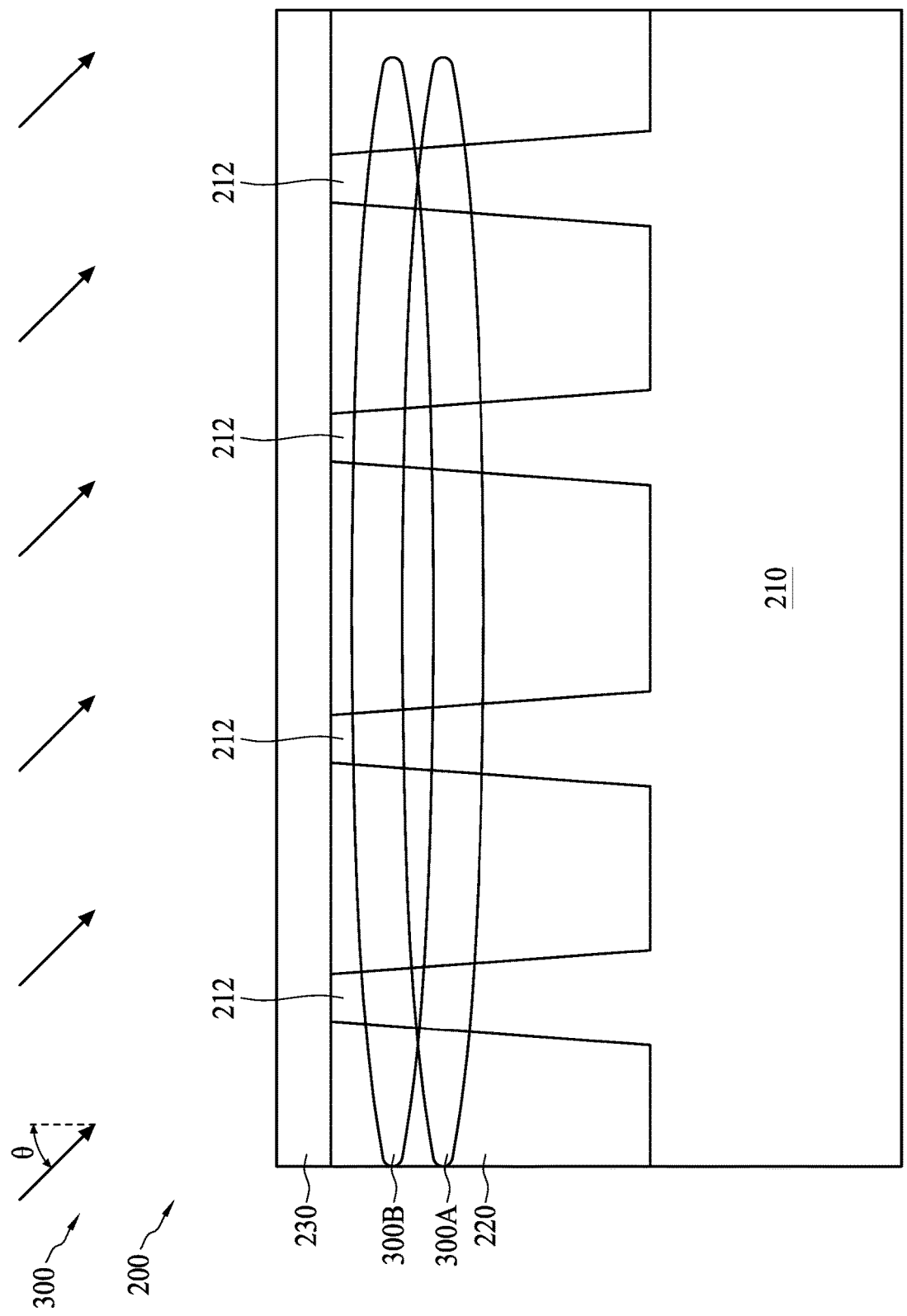
Figure 15:
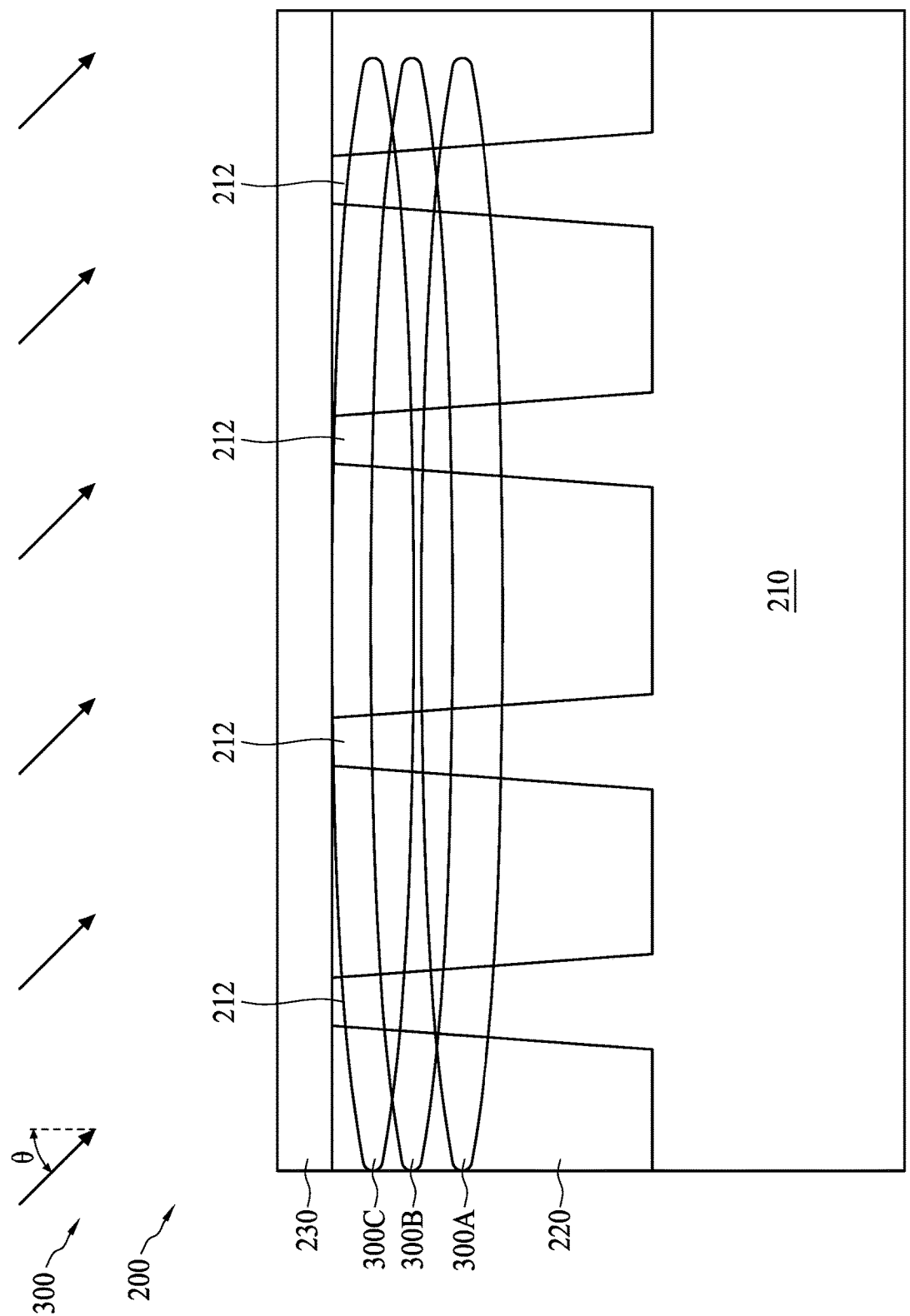

In some embodiments, the multi-implantation 300 may include two ion implantation cycles with stepwise increased or decreased energy. For example, the multi-implantation 300 may include three ion implantation cycles, the applied energy at the first ion implantation is from about 40 KeV to about 70 KeV, such that a first implanted region 300A is formed, as shown in FIG. 13. The applied implantation energy at the second ion implantation is from 20 KeV to 40 KeV, such that a second implanted region 300B is formed, as shown in FIG. 14. The applied implantation energy at the third ion implantation is from about 10 KeV to about 20 KeV, such that a third implanted region 300C is formed, as shown in FIG. 15.

Figure 16:
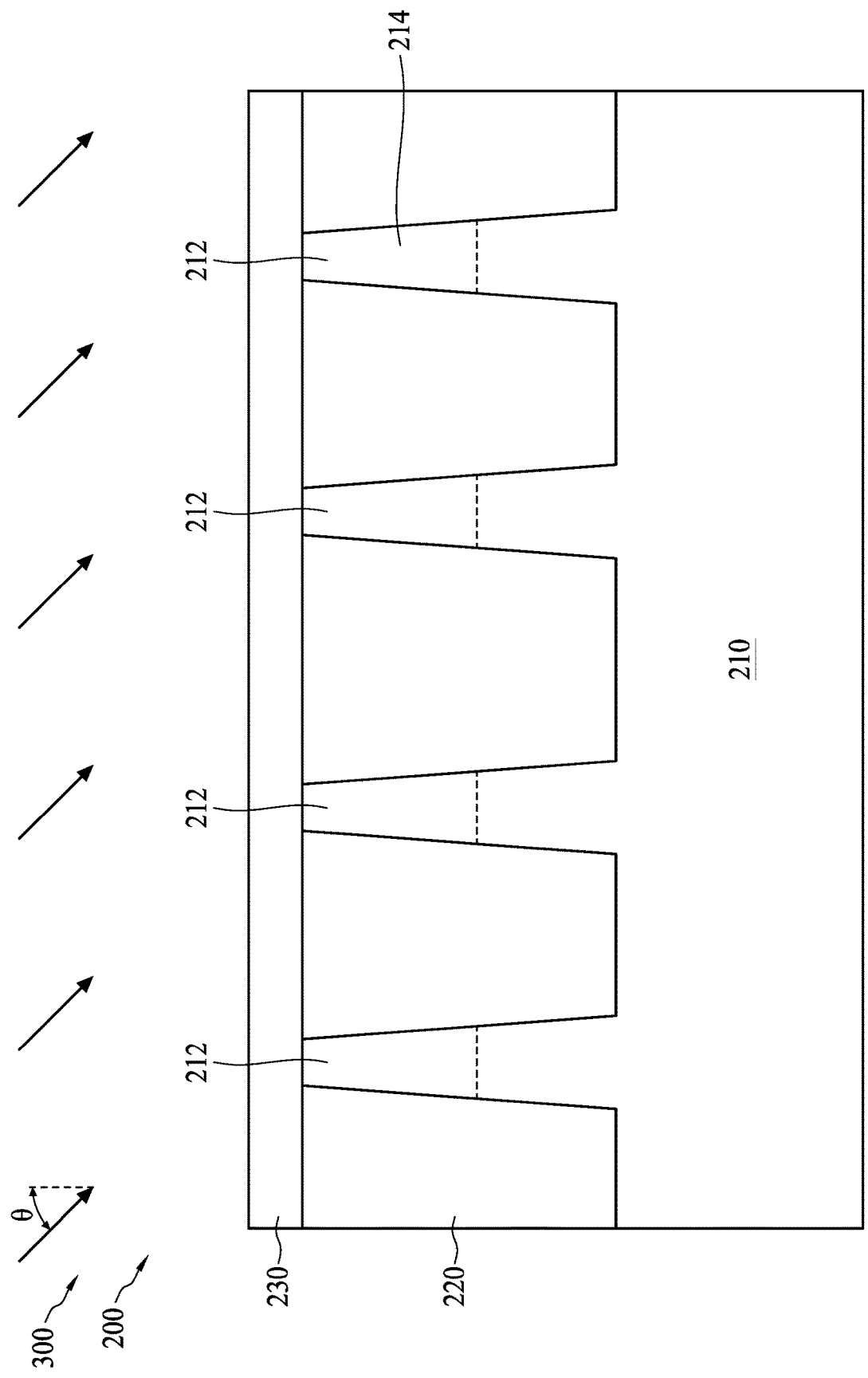

The method 100 then proceeds to operation 110 where a well anneal is performed at a temperature above approximately 1000° C., In one embodiment, the well anneal may be performed between about 1000° C. to about 1100° C. In some examples, the well anneal may be performed for a duration of few seconds, such as about 10 s. While some examples of annealing temperature and duration have been given, these examples are merely exemplary and are not meant to be limiting in any way. Other annealing temperatures and/or durations may also be used in accordance with various process conditions and/or device requirements, as known in the art. Consequently, a well region 214 is formed in each of the fin structure 212, as shown in FIG. 16. In some embodiments, the sacrificial layer 230 can be removed after annealing.

As discussed above, the dopant concentration shows Gaussian distribution with respect to different levels of depth in the target to be implanted. Applying implantation several times with substantially identical energy or different energy levels provides the fin structure 212 with uniform doping profile after annealing.

Figure 17:
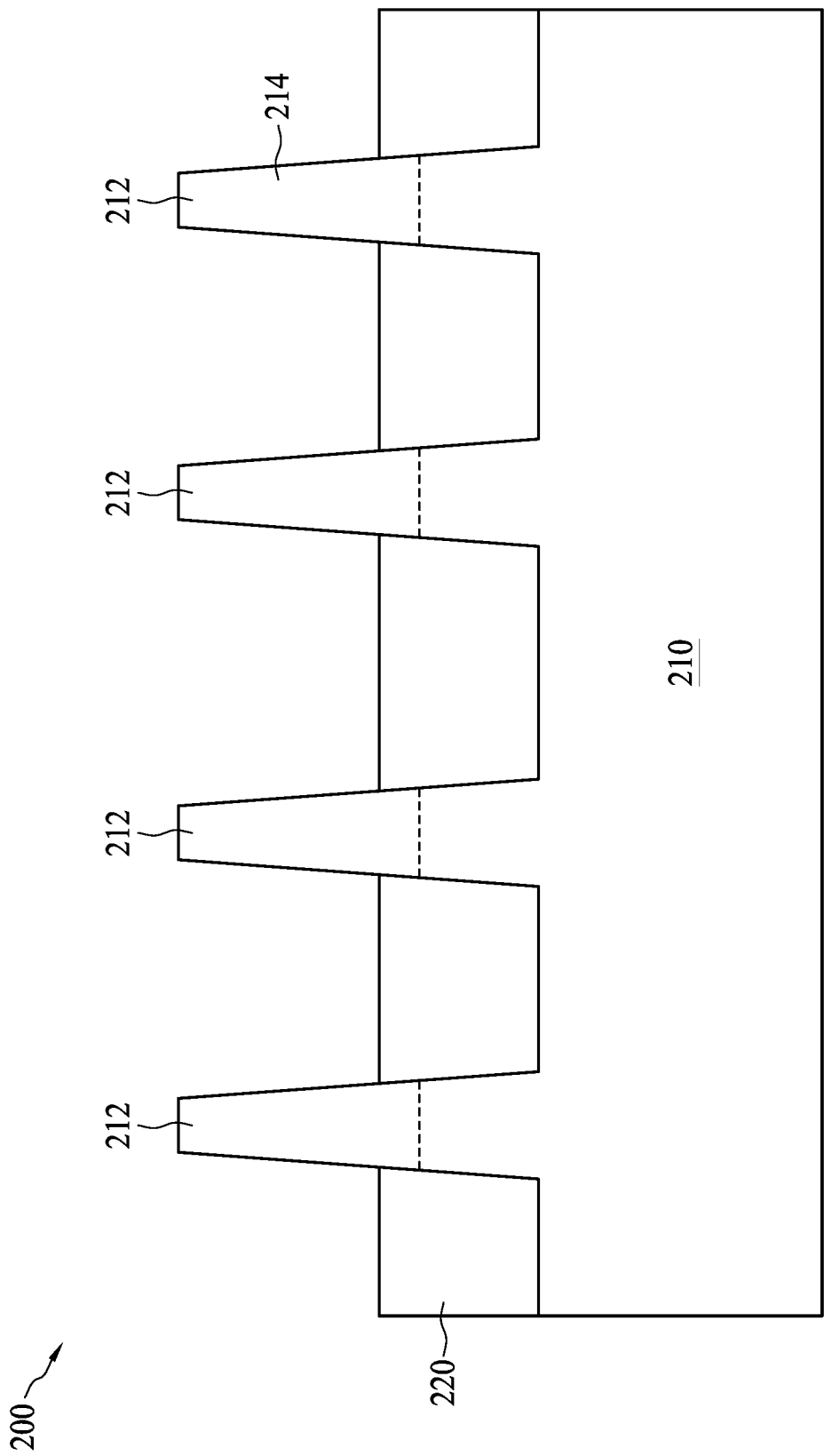

At operation 112, a portion of the insulation material 230 is removed. With further reference to FIG. 17, the sidewalls of the fin structure 212 are exposed by removing at least a portion of the insulation material 220. In one embodiment, the top of the fin structure 212 may also be exposed by removing the sacrificial oxide 230.

Figure 18:
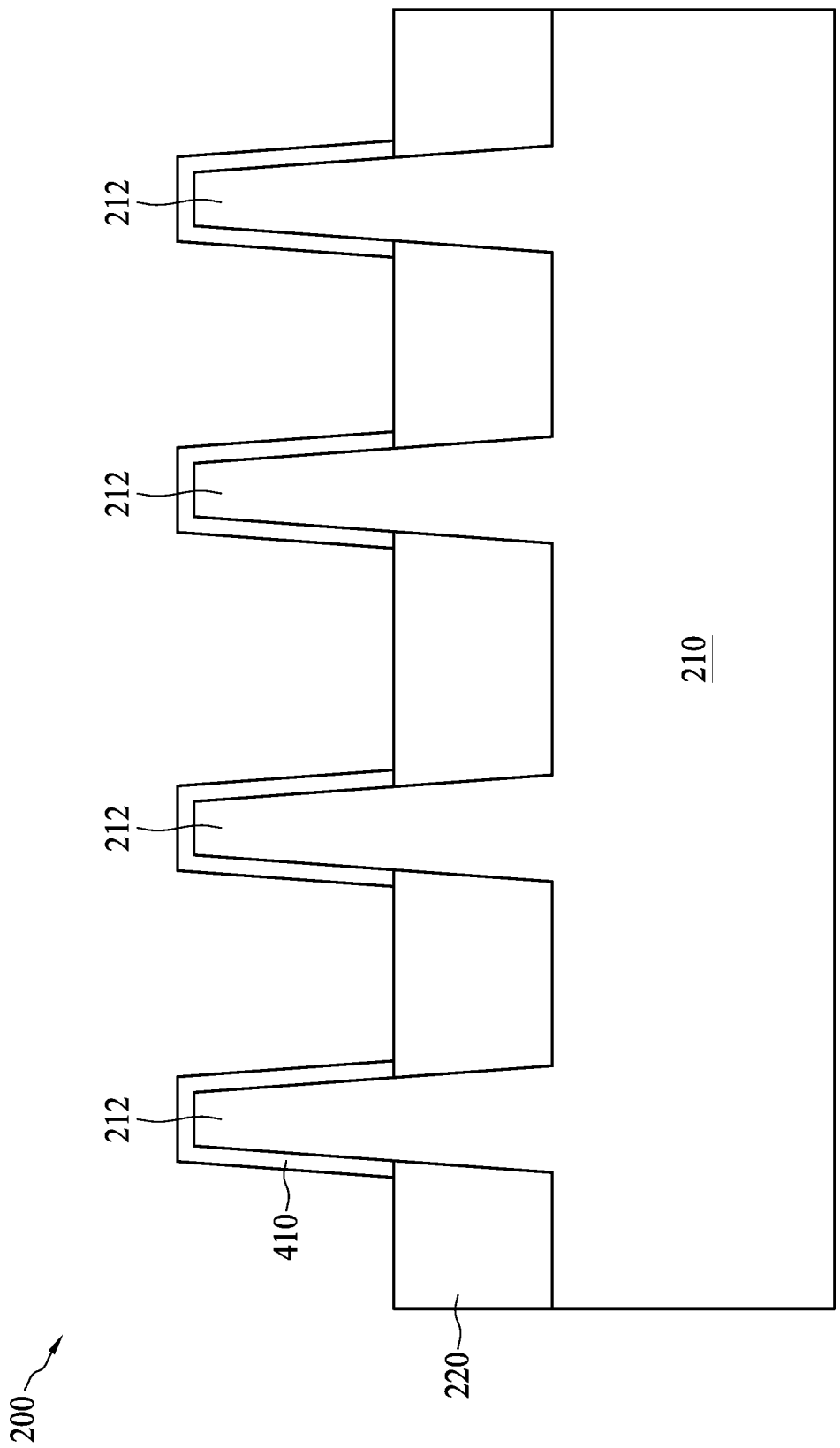
Figure 19:
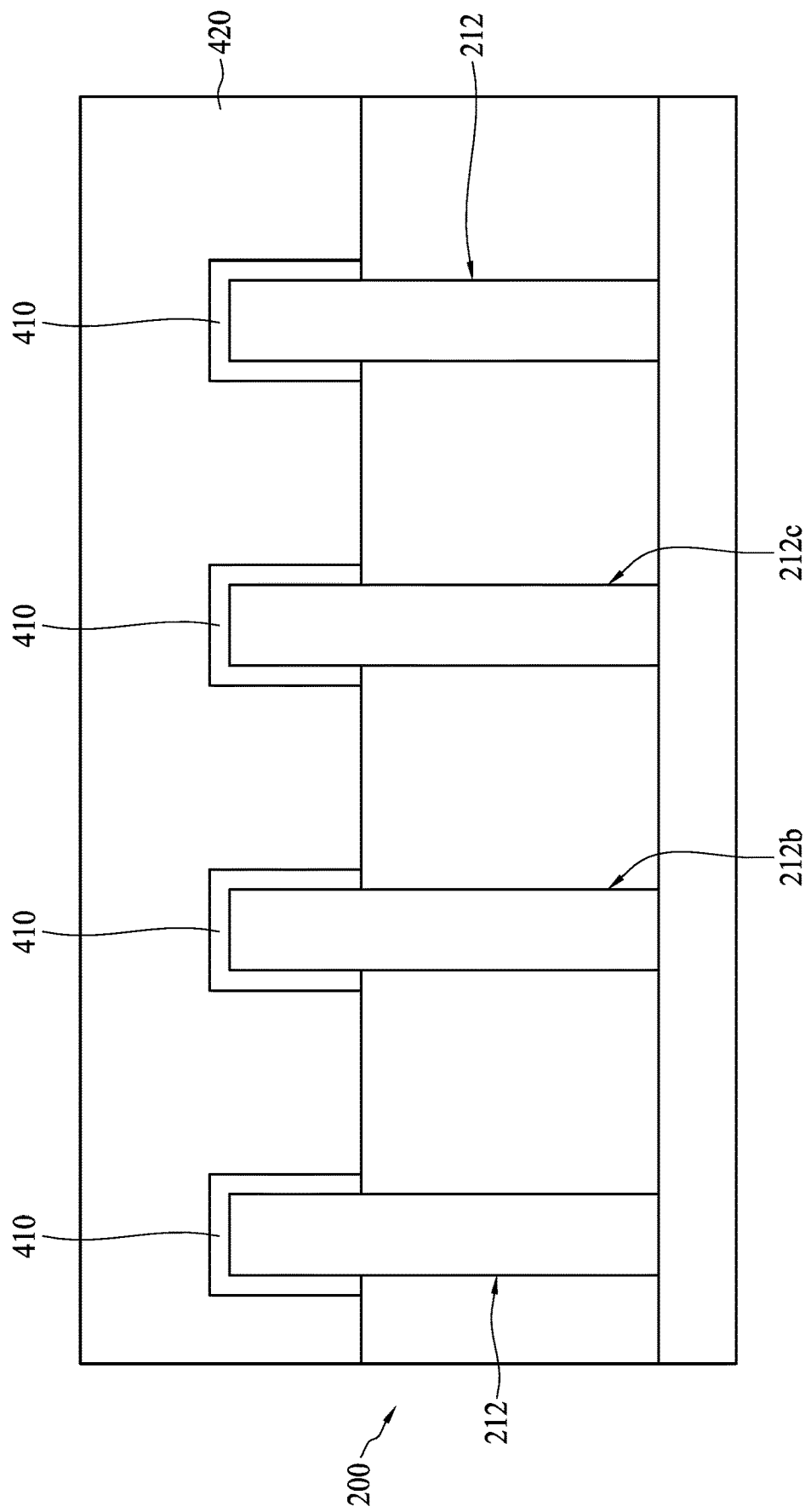
Figure 20:
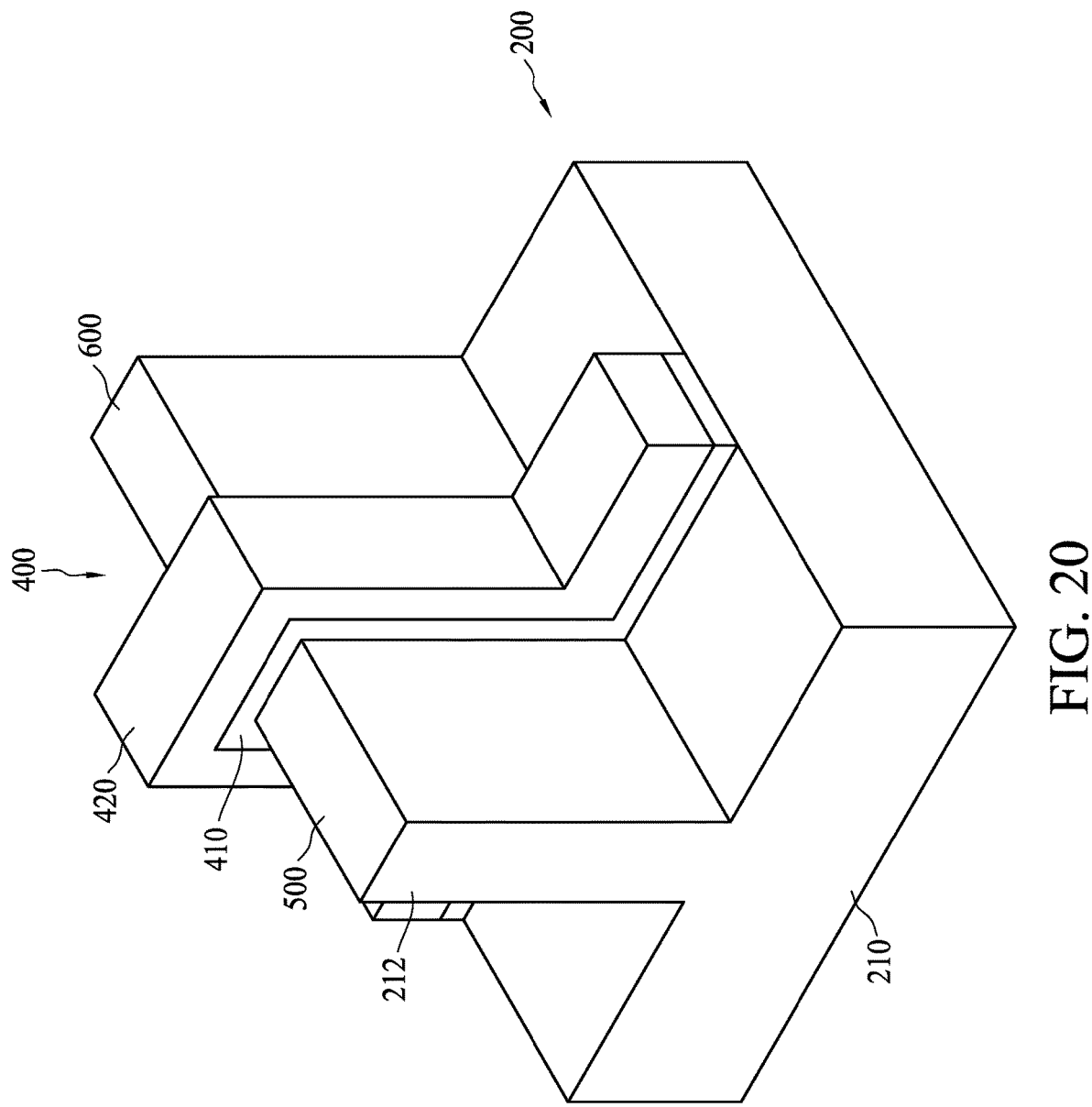
FIG. 20 illustrates a perspective view of the embodiments of the semiconductor structure of FIGS. 2-9 or FIGS. 10-19.

With further reference to FIGS. 18 to 20, a gate structure 400 is formed over a portion of the fin structure 212. The gate structure 400 includes a gate dielectric layer 410 and a gate electrode 420. The gate dielectric layer 410 is formed along sidewalls and over a top of the fin structure 212, and the gate electrode 420 is formed over the gate dielectric layer 410. Source/drain regions 500 and 600 are formed in opposite sides of the fin structure 212 with respect to the gate structure 400.

Figure 21:
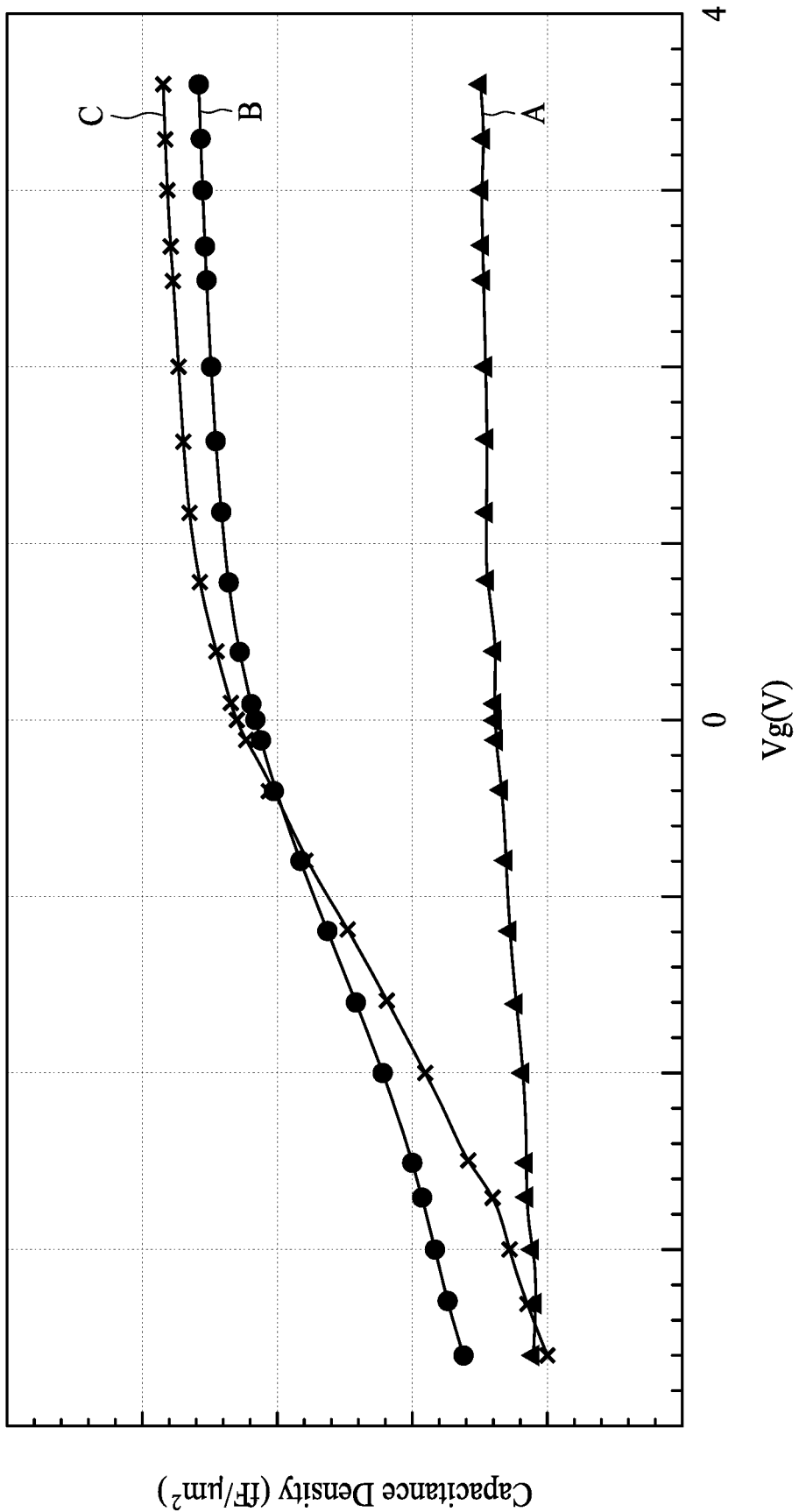
FIG. 21 illustrates a diagram showing capacitance density versus the gate voltage.

Referring to FIG. 20, accordingly, the semiconductor structure 200 includes a fin structure 212, a gate dielectric layer 410 covering a portion of the fin structure 210, a gate electrode 420 over the gate dielectric layer 410, a source/drain regions 500 and 600 formed in opposite sides of the fin structure 212 with respect to the gate structure 400. As mentioned above, the multi-implantation 300 improves the uniformity of the dopant concentration in the fin structure 212. In some embodiments, the dopant concentration at the sidewalk of the fin structure 212 is substantially identical to that at the top of the fin structure 212. With the multi-implantation 300, the resulting semiconductor structure 200 of the present invention has linearity in capacitance less than about 5% as applied with a gate voltage from −3V to 3V. In one embodiment, the resulting semiconductor structure has linearity of capacitance less than 3% as applied with a gate voltage from −3V to 3V. The improved linearity in capacitance improves the device performance. FIG. 21 shows that, compared to semiconductor structures 200 with a tin structure undergoing one implantation (see lines B and C), the semiconductor structure of the present invention has smooth capacitance density (see line A) as the gate voltage increases.

In the present disclosure, a method of manufacturing a semiconductor structure comprises providing a substrate; forming a plurality of fin structures over the substrate; forming an insulation material in a plurality of gaps between the fin structures; forming a sacrificial layer on the fin structures and the insulation material; applying a plurality of ion implantation cycles to the fin structures; and removing at least a portion of the insulation material to expose at least a top portion of each fin structure, wherein applying the plurality of ion implantation cycles comprises applying different implantation energies.

In some embodiments, a method of manufacturing a semiconductor structure comprises providing a substrate; forming a plurality of tin structures over the substrate; forming an insulation material in a plurality of gaps between the fin structures; forming a sacrificial layer on the fin structures and the insulation material; applying a plurality of ion implantation cycles to the fin structures in-situ with stepwise increased or decreased energy and in a stepwise increased or decreased temperature; and removing at least a portion of the insulation material to expose at least a top portion of each fin structure, wherein applying the plurality of ion implantation cycles comprises: performing a first ion implantation with a first implantation energy to form a first implanted region of the fin structures; performing a second ion implantation with a second implantation energy to form a second implanted region of the tin structures; and performing a third ion implantation with a third implantation energy to form a third implanted region of the fin structures.

In some embodiments, a method of manufacturing a semiconductor structure, comprises providing a substrate; forming a plurality of fin structures over the substrate; forming an insulation material in a plurality of gaps between the fin structures; forming a sacrificial layer on the fin structures and the insulation material; applying a first ion implantation to the fin structures with a first implantation energy to form a first implanted region of the fin structures; applying a second ion implantation to the fin structures with a second implantation energy to form a second implanted region of the fin structures; applying a third ion implantation to the fin structures with a third implantation energy to form a third implanted region of the fin structures; and removing at least a portion of the insulation material to expose at least a top surface of each fin structure, wherein the first implantation energy is greater than the second implantation energy, and the second implantation energy is greater than the third implantation energy, and wherein each of the plurality of ion-implantation cycles is applied with a tilt angle with respect to the vertical axis from about 5° to about 70°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a substrate;
   forming a plurality of fin structures over the substrate;
   forming an insulation material in a plurality of gaps between the fin structures;
   forming a sacrificial layer on the fin structures and the insulation material;
   applying a plurality of ion implantation cycles to the fin structures; and
   removing at least a portion of the insulation material to expose at least a top portion of each fin structure,
   wherein applying the plurality of ion implantation cycles comprises:
   performing a first ion implantation with a first implantation energy to form a first implanted region of the fin structures;
   performing a second ion implantation with a second implantation energy to form a second implanted region of the fin structures; and
   performing a third ion implantation with a third implantation energy to form a third implanted region of the fin structures,
   wherein the first implanted region is located at a depth of about 35% to about 50% of the fin structure, the second implantation region is located at a depth of about 15% to about 35% of the fin structure, and the third implantation region is located at a depth of about 15% or less of the fin structure.

2. The method of claim 1, wherein the plurality of ion implantation cycles are performed at a constant temperature.

3. The method of claim 1, wherein the first implantation energy, the second implantation energy and the third implantation energy are decreased stepwise in a range from about 10 KeV to about 70 KeV.

4. The method of claim 1, wherein applying the plurality of ion implantation cycles comprises applying stepwisely decreased energy.

5. The method of claim 1, wherein applying the plurality of ion implantation cycles comprises applying stepwisely-decreased energy at a constant temperature.

6. The method of claim 1, wherein each of the plurality of ion implantation cycles is applied with a tilt angle with respect to the vertical axis from about 5° to about 70°.

7. The method of claim 1, wherein each fin structure has a height ranging from about 20 nm to about 100 nm.

8. The method of claim 1, wherein each of the plurality of ion implantation cycles is applied with an implantation dose from about 1E15 atm/cm$^2$ to about 5E15 atm/cm$^2$.

9. The method of claim 1, further comprising performing an anti-punch-through (APT) dopant implantation before forming the fin structures over the substrate.

10. A method of manufacturing a semiconductor structure, comprising:
    providing a substrate;
    forming a plurality of fin structures over the substrate;
    forming an insulation material in a plurality of gaps between the fin structures;
    forming aسacrificial layer on the fin structures and the insulation material;
    applying a plurality of ion implantation cycles to the fin structures in-situ with stepwise increased or decreased energy and in a stepwise increased or decreased temperature; and
    removing at least a portion of the insulation material to expose at least a top portion of each fin structure,
    wherein applying the plurality of ion implantation cycles comprises:
    performing a first ion implantation with a first implantation energy to form a first implanted region of the fin structures;
    performing a second ion implantation with a second implantation energy to form a second implanted region of the fin structures; and
    performing a third ion implantation with a third implantation energy to form a third implanted region of the fin structures.

11. The method of claim 10, wherein each of the ion implantation cycles is performed with substantially identical energy in a range from about 10 KeV to about 70 KeV.

12. The method of claim 10, wherein the first ion implantation energy is greater than the second ion implantation energy, and the second implantation energy is greater than the third implantation energy.

13. The method of claim 12, wherein the first implanted region is located at a depth of about 30% to about 50% of each fin structure and the second implanted region is located at a depth of about 30% or less of each fin structure.

14. The method of claim 10, wherein each of the ion implantation cycles is applied with a tilt angle with respect to the vertical axis from about 5° to about 70°.

15. The method of claim 10, wherein each of the ion implantation cycles is applied with an implantation dose from about 1E15 atm/cm$^2$ to about 5E15 atm/cm$^2$.

16. The method of claim 10, further comprising performing an anti-punch-through (APT) dopant implantation before forming the fin structures over the substrate.

17. A method of manufacturing a semiconductor structure, comprising:
    providing a substrate;
    forming a plurality of fin structures over the substrate;
    forming an insulation material in a plurality of gaps between the fin structures;
    forming a sacrificial layer on the fin structures and the insulation material;
    applying a first ion implantation to the fin structures with a first implantation energy to form a first implanted region of the fin structures;
    applying a second ion implantation to the fin structures with a second implantation energy to form a second implanted region of the fin structures;
    applying a third ion implantation to the fin structures with a third implantation energy to form a third implanted region of the fin structures; and
    removing at least a portion of the insulation material to expose at least a top surface of each fin structure,
    wherein the first implantation energy is greater than the second implantation energy, and the second implantation energy is greater than the third implantation energy, and
    wherein each of the plurality of ion-implantation cycles is applied with a tilt angle with respect to the vertical axis from about 5° to about 70°.

18. The method of claim 17, wherein the first implanted region is located at a depth of about 35% to about 50% of each fin structure, the second implanted region is located at a depth of about 15% to about 35% of each fin structure, and the third implanted region is located at a depth of about 15% or less of each fin structure.

19. The method of claim 17, wherein the implantation energies are increased or decreased stepwise in a range from about 10 KeV to about 70 KeV.

20. The method of claim 17, further comprising performing a well anneal to form a well region.

* * * * *